United States Patent
Tsujita et al.

(10) Patent No.: US 10,573,591 B2
(45) Date of Patent: Feb. 25, 2020

(54) ELECTRONIC COMPONENT MOUNTING BOARD, ELECTRONIC DEVICE, AND ELECTRONIC MODULE

(71) Applicant: KYOCERA Corporation, Kyoto-shi, Kyoto (JP)

(72) Inventors: Toshihide Tsujita, Satsumasendai (JP); Naoki Hijikuro, Satsumasendai (JP)

(73) Assignee: KYOCERA CORPORATION, Kyoto-Shi (JP)

( * ) Notice: Subject to any disclaimer, the term of this patent is extended or adjusted under 35 U.S.C. 154(b) by 0 days.

(21) Appl. No.: 15/896,649

(22) Filed: Feb. 14, 2018

(65) Prior Publication Data

US 2018/0240746 A1 Aug. 23, 2018

(30) Foreign Application Priority Data

Feb. 22, 2017 (JP) .................. 2017-031284
May 29, 2017 (JP) .................. 2017-105595

(51) Int. Cl.
| | |
|---|---|
| H01L 23/498 | (2006.01) |
| H01L 23/055 | (2006.01) |
| H01L 21/48 | (2006.01) |
| H01L 27/146 | (2006.01) |
| H01L 33/62 | (2010.01) |
| H01L 33/48 | (2010.01) |

(Continued)

(52) U.S. Cl.
CPC .... *H01L 23/49838* (2013.01); *H01L 21/4857* (2013.01); *H01L 23/053* (2013.01); *H01L 23/055* (2013.01); *H01L 23/49822* (2013.01); *H01L 23/552* (2013.01); *H01L 27/14618* (2013.01); *H01L 27/14636* (2013.01); *H01L 33/486* (2013.01); *H01L 33/62* (2013.01); *H01L 23/10* (2013.01); *H01L 23/13* (2013.01); *H01L 23/15* (2013.01); *H01L 23/562* (2013.01); *H01L 24/48* (2013.01); *H01L 24/49* (2013.01); *H01L 2224/48091* (2013.01); *H01L 2224/48227* (2013.01); *H01L 2224/49176* (2013.01); *H01L 2924/12041* (2013.01); *H01L 2924/14* (2013.01); *H01L 2924/16195* (2013.01); *H01L 2924/3025* (2013.01); *H01L 2924/3512* (2013.01)

(58) Field of Classification Search
None
See application file for complete search history.

(56) References Cited

U.S. PATENT DOCUMENTS

| | | | | |
|---|---|---|---|---|
| 2015/0053467 A1* | 2/2015 | Hayashi | ............... | H05K 1/112 174/255 |
| 2015/0319846 A1* | 11/2015 | Kubo | ............... | H05K 1/0216 361/767 |
| 2015/0366061 A1* | 12/2015 | Noda | ............... | H01L 23/13 361/803 |

FOREIGN PATENT DOCUMENTS

| | | |
|---|---|---|
| JP | 09-312471 A | 12/1997 |
| JP | 2011-165992 A | 8/2011 |

* cited by examiner

*Primary Examiner* — Steven B Gauthier
(74) *Attorney, Agent, or Firm* — Volpe and Koenig, P.C.

(57) ABSTRACT

An electronic component mounting board reduces short-circuiting between a plurality of thick wiring conductors to improve reliability and electrical characteristics. An electronic component mounting board (1) includes a substrate (2) including a mount area (4) in which an electronic component (10) is mountable, a first insulating layer (2a) overlapping the mount area (4), a second insulating layer (2b) on a lower surface of the first insulating layer (2a), and a first metal layer (5) between the first insulating layer (2a) and the second insulating layer (2b).

13 Claims, 23 Drawing Sheets

(51) Int. Cl.
  *H01L 23/552*   (2006.01)
  *H01L 23/053*   (2006.01)
  *H01L 23/00*   (2006.01)
  *H01L 23/10*   (2006.01)
  *H01L 23/13*   (2006.01)
  *H01L 23/15*   (2006.01)

ELECTRONIC COMPONENT MOUNTING BOARD, ELECTRONIC DEVICE, AND ELECTRONIC MODULE

BACKGROUND

1. Technical Field

The present invention relates to an electronic component mounting board on which an electronic component, such as an imaging device including a charge-coupled device (CCD) or a complementary metal oxide semiconductor (CMOS) device, a light-emitting device including a light emitting diode (LED), and an integrated circuit, is mounted, and to an electronic device and an electronic module.

2. Description of the Background

An electronic component mounting board including a wiring board formed from insulating layers is known. An electronic device incorporating such an electronic component mounting board and an electronic component mounted on the mounting board is also known (refer to Japanese Unexamined Patent Application Publication No. 9-312471).

The electronic component mounting board may have shield cases covering electronic components or electronic parts to reduce electromagnetic noise. Such shield cases allow excess gaps between the cases, and may upsize the electronic device.

BRIEF SUMMARY

An electronic component mounting board according to one aspect of the present invention includes a substrate that includes a mount area in which an electronic component is mountable, a first insulating layer overlapping the mount area, a second insulating layer located on a lower surface of the first insulating layer, and a first metal layer located between the first insulating layer and the second insulating layer.

An electronic device according to another aspect of the present invention includes an electronic component mounting board, and an electronic component mounted on the electronic component mounting board.

An electronic module according to still another aspect of the present invention includes an electronic device, and a housing located on an upper surface of the electronic device or containing the electronic device.

DETAILED DESCRIPTION

Embodiments
Structures of Electronic Component Mounting Board and Electronic Device Embodiments of the present invention will now be described by way of example with reference to the drawings. In the embodiments described below, an electronic device includes an electronic component mounted on an electronic component mounting board with a lid bonded to the upper surface of the electronic component mounting board. An electronic module includes a housing or a member covering the upper or lower surface of the electronic component mounting board or the electronic device. Although the electronic component mounting board, the electronic device, and the electronic module may be arranged to comprise any of their faces upward or downward, they are herein defined using the orthogonal xyz coordinate system with the positive z direction upward for ease of explanation.

First Embodiment

Figure 3A:
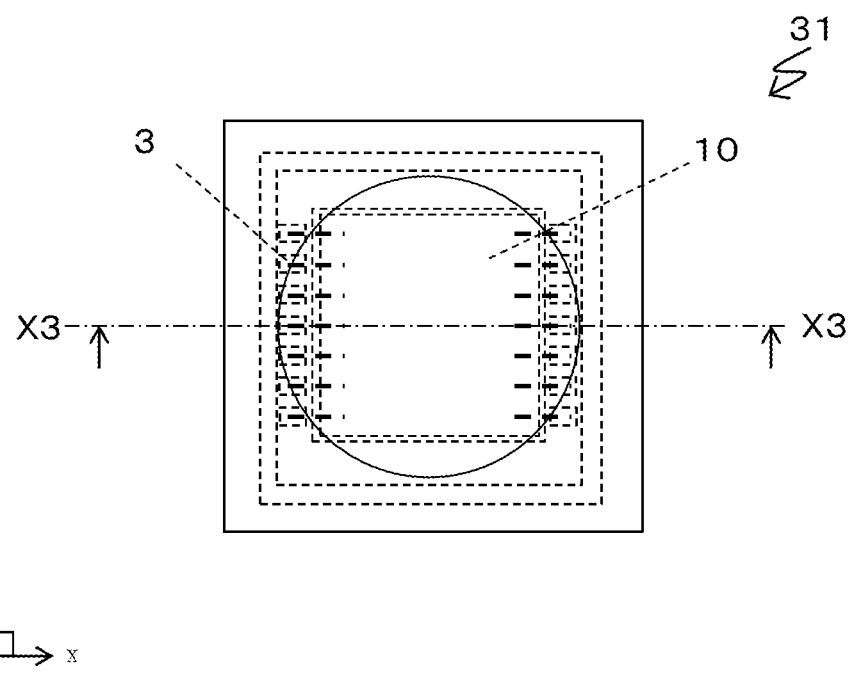
FIG. 3A is an external top view of an electronic component mounting board, an electronic device, and an electronic module according to a modification of the first embodiment of the present invention.
Figure 3B:
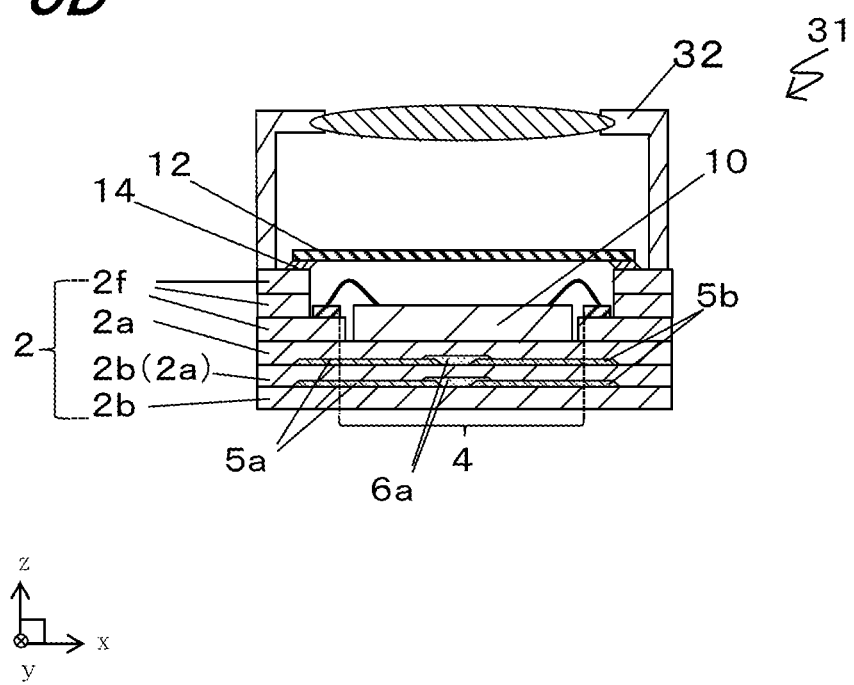
FIG. 3B is a cross-sectional view taken along line X3-X3 in FIG. 3A.

An electronic module 31, an electronic device 21, and an electronic component mounting board 1 according to a first embodiment of the present invention will be described with reference to FIGS. 1A to 3B, and a method for manufacturing the electronic component mounting board 1 according to the first embodiment of the present invention will be described with reference to FIGS. 4A to 5B. The electronic device 21 according to the present embodiment includes the electronic component mounting board 1 and an electronic component 10. In the present embodiment, FIGS. 1A to 2B show the electronic device 21, FIGS. 3A and 3B show the electronic module 31, and FIGS. 4A to 5B show processes for manufacturing a main part of the electronic component mounting board 1. In FIGS. 2A to 5B, the dots and solid lines indicate a first insulating film 6a (first insulating paste 46a).

The electronic component mounting board 1 includes a substrate 2. The substrate 2 includes a mount area 4, in which the electronic component 10 is mountable. The substrate 2 includes a first insulating layer 2a overlapping the mount area 4 and a second insulating layer 2b on the lower surface of the first insulating layer 2a. The substrate 2 includes a first metal layer 5 between the first insulating layer 2a and the second insulating layer 2b.

Figure 6A:
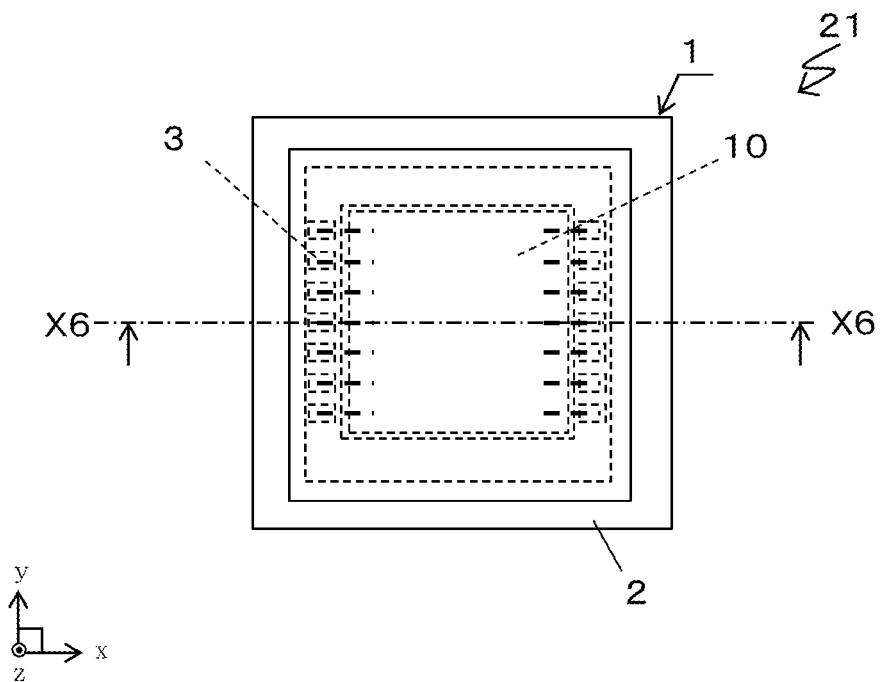
FIG. 6A is an external top view of an electronic component mounting board and an electronic device according to a second embodiment of the present invention.
Figure 6B:
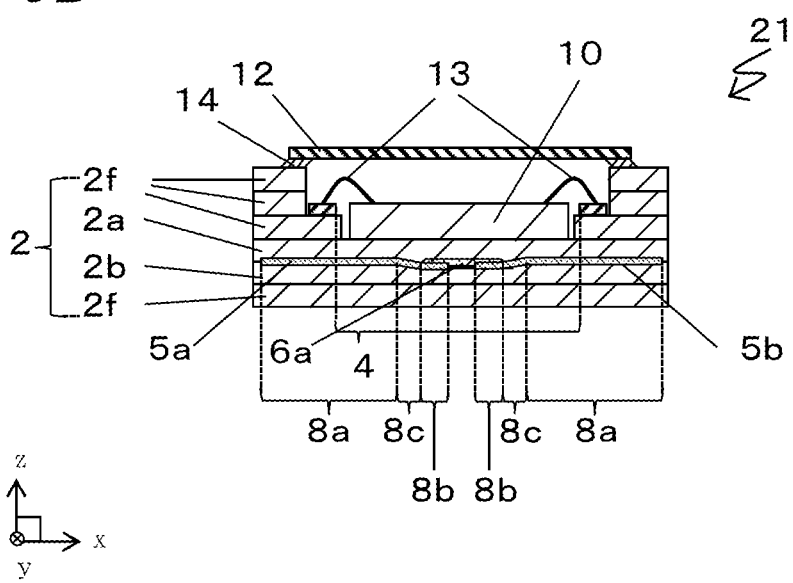
FIG. 6B is a cross-sectional view taken along line X6-X6 in FIG. 6A.

The electronic component mounting board 1 includes the substrate 2. The substrate 2 includes the mount area 4, in which the electronic component 10 is mountable. As in the examples shown in FIGS. 1A to 3B, a plurality of electrodes 3 may be arranged on both sides of the mount area 4. The plurality of electrodes 3 include at least two electrodes. In the present embodiment, the plurality of electrodes 3 have their inner ends defining the mount area 4, in which the electronic component 10 is mountable. The inner ends of the electrodes 3 are the inner ends of an area for receiving electronic component connections 13 for connecting the electrodes 3 and the electronic component 10. Conductive wires may extend inward from the area. The mount area 4 is an area in which the electronic component 10 is mountable, and may also be an area without having the electrodes 3 on its both sides or an area without any electrodes 3. The mount area 4 may be around the center of the substrate 2 or may deviate from the center of the substrate 2. As viewed from above, the mount area 4 may either extend over or be within the outer edge of the electronic component 10 as in FIGS. 6A and 6B described later.

The substrate 2 includes the first insulating layer 2a overlapping the mount area 4 and the second insulting layer 2b on the lower surface of the first insulating layer 2a. As in the examples shown in FIGS. 1A to 3B, the electronic component mounting board 1 may include an additional insulating layer 2f, in addition to the first insulating layer 2a and the second insulating layer 2b.

The first insulating layer 2a, the second insulating layer 2b, and the additional insulating layer 2f comprised, for example, an electrical insulating ceramic material or a resin including plastics or a thermoplastic resin. An insulating substrate including the first insulating layer 2a, the second insulating layer 2b, and the additional insulating layer 2f, and having the mount area 4 is hereafter referred to as the substrate 2.

Examples of the electrical insulating ceramic material used for the insulating layers forming the first insulating layer 2a, the second insulating layer 2b, and the additional insulating layer 2f include sintered aluminum oxide, sintered mullite, sintered silicon carbide, sintered aluminum nitride, sintered silicon nitride, and sintered glass ceramic. Examples of the resin used for the insulating layers forming the first insulating layer 2a, the second insulating layer 2b, and the additional insulating layer 2f include a thermoplastic resin, an epoxy resin, a polyimide resin, an acryl resin, a phenolic resin, and a fluorine-based resin. Examples of the fluorine-based resin include a polyester resin and a polytetrafluoroethylene resin.

Figure 1A:
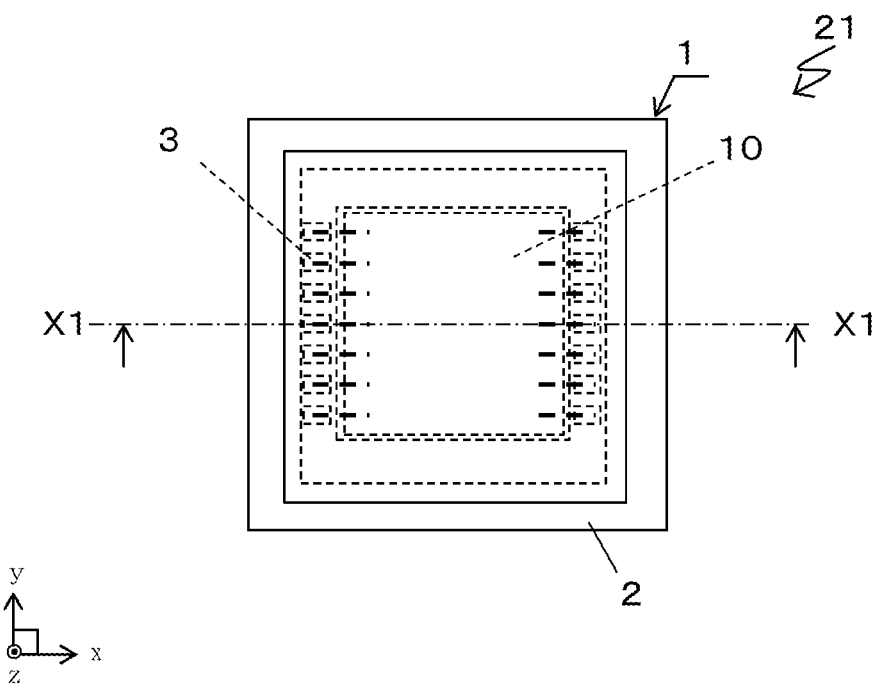
FIG. 1A is an external top view of an electronic component mounting board and an electronic device according to a first embodiment of the present invention.
Figure 1B:
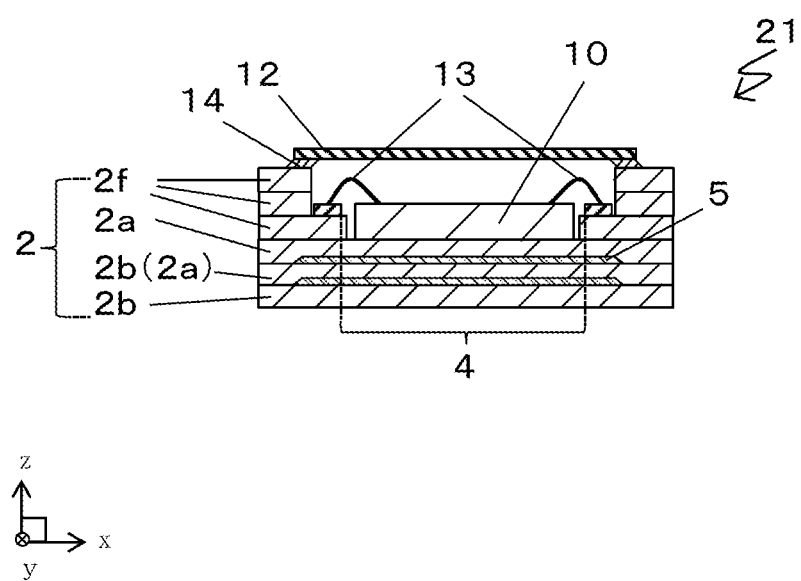
FIG. 1B is a cross-sectional view taken along line X1-X1 in FIG. 1A.
Figure 2A:
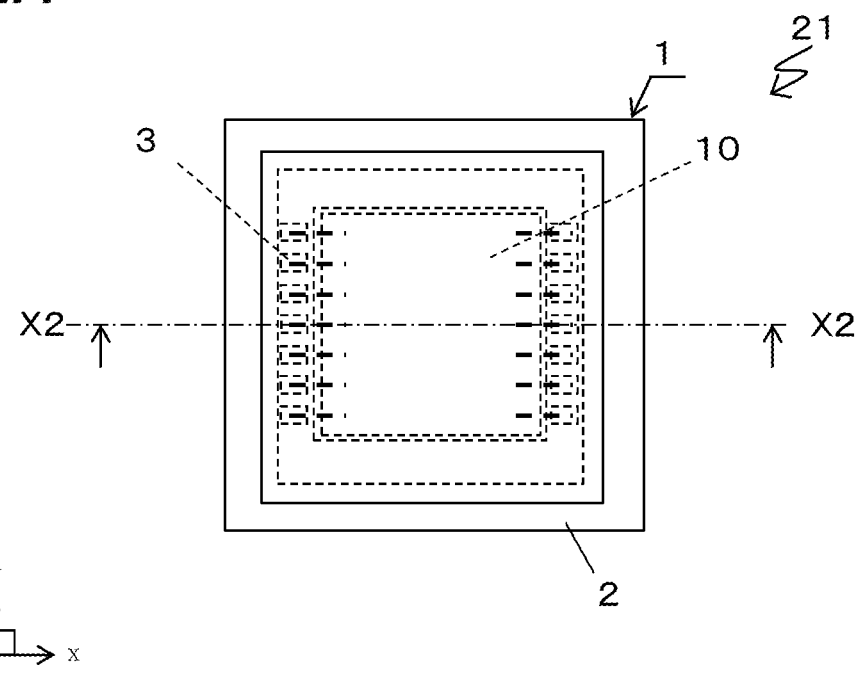
FIG. 2A is an external top view of an electronic component mounting board and an electronic device according to a modification of the first embodiment of the present invention.
Figure 2B:
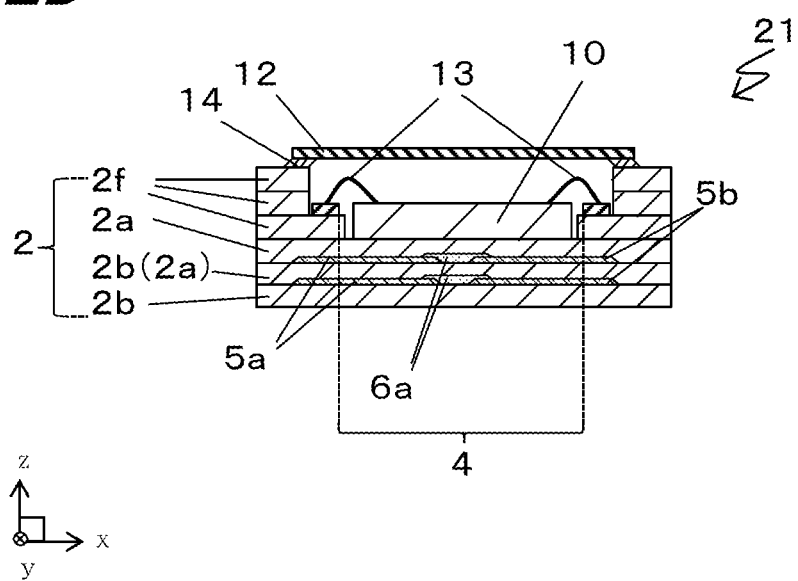
FIG. 2B is a cross-sectional view taken along line X2-X2 in FIG. 2A.

The substrate 2 may further include a plurality of additional insulating layers 2f stacked on one another on the upper surface of the first insulating layer 2a and/or on the lower surface of the second insulating layer 2b. The substrate 2 including the first insulating layer 2a, the second insulating layer 2b, and the additional insulating layer 2f may include six insulating layers as shown in FIG. 1B, or may include five or less, or seven or more insulating layers. The use of five or less layers reduces the thickness of the electronic component mounting board 1. The use of six or more layers increases the rigidity of the electronic component mounting board 1. As in the examples shown in FIGS. 1A to 3B, the insulating layers may comprise openings with different sizes. The openings may define a step, on which the electrodes 3 (described later) may be placed.

The electronic component mounting board 1 comprises an outermost perimeter with a length of, for example, 0.3 mm to 10 cm on one side, and may be rectangular or square as viewed from above. The electronic component mounting board 1 comprises a thickness of, for example, at least 0.2 mm. In some embodiments, the thickness is not more than 0.2 mm.

The electronic component mounting board 1 includes the substrate 2 which includes the first metal layer 5 between the first insulating layer 2a and the second insulating layer 2b. The first metal layer 5 may be electrically connected to, for example, the electrodes 3 (described later) and electrodes for connection to external circuits, or may be independent of other signals.

In the examples shown in FIGS. 2A to FIGS. 3B, the electronic component mounting board 1 includes the first metal layer 5, which includes a first wire 5a and a second wire 5b that are spaced from the first wire 5a. The substrate 2 may include the electrodes 3 on its surface. The electrodes 3 herein are arranged on the surface of at least one of the first insulating layer 2a, the second insulating layer 2b, and the additional insulating layer 2f as viewed from above. The electrodes 3 may thus be arranged on the surface of at least one of or each of the first insulating layer 2a, the second insulating layer 2b, and the additional insulating layer 2f.

The substrate 2 may comprise pads for connection to external circuits (or simply pads) on its upper surface, side surface, or lower surface. The pads electrically connect the substrate 2 or the electronic device 21 to external circuit boards.

In addition to the electrodes 3, the first wire 5a, and the second wire 5b, the substrate 2 may contain inner wires between the insulating layers, and feedthrough conductors that vertically connect the inner wires on the upper surfaces or the lower surfaces of the first insulating layer 2a, the second insulating layer 2b, and the additional insulating layer 2f. The inner wires or the feedthrough conductors may be uncovered on the surface of the substrate 2. The inner wires or the feedthrough conductors may electronically connect the electrodes 3, and the first wire 5a and the second wire 5b to the pads.

When the first insulating layer 2a, the second insulating layer 2b, and the additional insulating layer 2f comprised an electrical insulating ceramic material, the electrodes 3, the first metal layer 5 (the first wire 5a and the second wire 5b), the pads, the inner wires, and the feedthrough conductors include tungsten (W), molybdenum (Mo), manganese (Mn), silver (Ag), or copper (Cu), or an alloy containing one or more of these metals. When the first insulating layer 2a, the second insulating layer 2b, and the additional insulating layer 2f comprised a resin, the electrodes 3, the first metal layer 5 (the first wire 5a and the second wire 5b), the pads, the inner wires, and the feedthrough conductors include copper (Cu), gold, (Au), aluminum (Al), nickel, (Ni), molybdenum (Mo), or titanium (Ti), or an alloy containing one or more of these metals.

The uncovered surfaces of the electrodes 3, the pads, the inner wires, and the feedthrough conductors may be plated. The plating layer protects the uncovered surfaces of electrodes 3, the pads, the inner wires, and the feedthrough conductors against oxidation. The plating also improves the electrical connection between the electrodes 3 and the electronic component 10 with electronic component connections 13, such as wire bonding. The plating layer may be, for example, a Ni plating layer with a thickness of 0.5 to 10 or this Ni plating layer may further be coated with a gold (Au) plating layer with a thickness of 0.5 to 3 µm.

The first wire 5a and the second wire 5b are spaced from each other. This spacing electrically insulates the first wire 5a from the second wire 5b. The first wire 5a and the second wire 5b may thus comprise different potentials or signals or may comprise the same potential or signal, and may be electrically connected to another part, such as an upper layer or a lower layer. The first wire 5a and the second wire 5b comprise a spacing of, for example, at least 20 µm or at least 1% of one side of the substrate 2.

The first wire 5a and the second wire 5b may be thin wires, such as signal wires, or may be wide and flat wires to serve as a ground potential or a power potential. When the first wire 5a and the second wire 5b are wide and flat wires serving as a ground potential or a power potential, the substrate may include an additional signal wire 5c, such as a signal wire, between the first wire 5a and the second wire 5b.

The electronic component mounting board 1 includes a first insulating film 6a that fills the space between the first wire 5a and the second wire 5b and extends from the upper surface of the first wire 5a to the upper surface of the second wire 5b. The electronic component mounting board 1 according to the present embodiment including the first insulating film 6a reduces unintended short-circuiting between the first wire 5a and the second wire 5b in the electronic component mounting board 1. More specifically, the process of stacking insulating layers may use an amount of lamination liquid exceeding the amount absorbable by the insulating layers. In this case, the first insulating film 6a filling the space between the first wire 5a and the second wire 5b reduces the first wire 5a and the second wire 5b from extending by absorbing the lamination liquid used in the stacking process. This structure thus reduces unintended short-circuiting between the first wire 5a and the second wire 5b in the electronic component mounting board 1. The first insulating film 6a may be thicker than the first wire 5a and the second wire 5b. The first insulating film 6a thicker than the first wire 5a and the second wire 5b increases the strength of the substrate 2, and reduces voids in the substrate 2.

The electronic component mounting board 1 according to the present embodiment including the first insulating film 6 comprises less voids (or less gas) between the first wire 5a and the second wire 5b. This reduces stress caused by the difference in thermal expansion between the substrate 2 and the voids when the electronic component 10 generates heat during operation or when the electronic component 10 or other parts are mounted with heat, and thus reduces cracks. Less voids in the structure equate to less cracks or breaks originating such voids.

The insulating layer to be the first insulating film 6a comprised, for example, an electrical insulating ceramic material or a resin. Examples of the resin include a thermoplastic resin, such as plastics.

Examples of the electrical insulating ceramic material used for the insulating layer forming the first insulating film 6a include sintered aluminum oxide, sintered mullite, sintered silicon carbide, sintered aluminum nitride, sintered silicon nitride, and sintered glass ceramic. Examples of the resin used for the insulating layer forming the first insulating film 6a include a thermoplastic resin, an epoxy resin, a polyimide resin, an acryl resin, a phenolic resin, and a fluorine-based resin. Examples of the fluorine-based resin include a polyester resin and a polytetrafluoroethylene resin.

As in the examples shown in FIGS. 1A to 2B, the electronic component mounting board 1 may include first wires 5a, second wires 5b, and additional wires 5c that are between multiple layers. The first wires 5a and the second wires 5b may be between adjacent multiple layers. In this structure, an insulating layer located between two layers is the second insulating layer 2b having the first wire 5a and the second wire 5b on its upper surface, and may also function as the first insulating layer 2a corresponding to a second insulating layer 2b having the first wire 5a and the second wire 5b on its lower surface. In other words, as in the examples shown in FIGS. 1A to 3B, the second insulating layer 2b may also function as a first insulating layer 2a corresponding to the underlying second insulating layer 2b.

When the first wires 5a and the second wires 5b are between multiple layers, the first insulating layers 6a between the multiple insulating layers may partially or fully overlap one another or may deviate from one another as viewed from above. The first insulating films 6a between multiple layers that partially or fully overlap one another as viewed from above can distinctively separate the area involving analogue signals and the area involving digital signals in the electronic component mounting board 1 that handle both analogue signals and digital signals. This structure thus reduces noise superimposed on analog signals and digital signals. The first insulating films 6a deviating as viewed from above can reduce steps on the first insulating films 6a and in the space, and thus maintains the overall flatness of the surface of the substrate 2.

The first insulating film 6a may comprised the same material as or from a material different from the first insulating layer 2a, the second insulating layer 2b, and the additional insulating layer 2f. The first insulating film 6a comprised the same material as the first insulating layer 2a, the second insulating layer 2b, and the additional insulating layer 2f will comprise basic physical properties including the coefficient of thermal expansion, heat conductivity, and the firing temperature, similar to those properties of the first insulating layer 2a, the second insulating layer 2b, and the additional insulating layer 2f. This allows stable fabrication of the electronic component mounting board 1, and further reduces cracks or other defects caused by differences in thermal expansion after the electronic component 10 is in use or when the electronic component 10 generates heat. The first insulating film 6a comprised a material different from the materials for the first insulating layer 2a, the second insulating layer 2b, and the additional insulating layer 2f may include a material selected as appropriate for their use conditions. For example, the first insulating film 6a may be formed from a material with higher viscosity to reduce the first wire 5a and the second wire 5b from extending.

The first insulating film 6a in the electronic component mounting board 1 may be integral with the first insulating layer 2a. For this structure, the first insulating film 6a may be sintered together with the first insulating layer 2a. The first insulating film 6a may be formed integrally with the first insulating layer 2a to reduce any gap between the first insulating film 6a and the first insulating layer 2a. This structure thus reduces the first wire 5a or the second wire 5b from extending over the upper surface of the first insulating film 6a and contacting each other.

The first insulating film 6a may entirely or partially overlap the first wire 5a and/or the second wire 5b as viewed from above. The first insulating film 6a entirely overlapping the first wire 5a and/or the second wire 5b as viewed from above reduces the first wire 5a and the second wire 5b from extending over the surface of the first insulating film 6a and short-circuiting. The first insulating film 6a partially overlapping the first wire 5a and/or the second wire 5b as viewed from above is electrically connected to the inner wires in the additional insulating layer 2f. This structure can also reduce the entire thickness of the substrate 2. The overlap between the first insulating film 6a and the first wire 5a and/or the second wire 5b is, for example, at least 30 μm on the longitudinal side. This structure reduces short-circuiting between the first wire 5a and the second wire 5b when the first insulating film 6a may deviate due to process errors during manufacture.

Electronic Device Structure

FIGS. 1A to 3B show examples of the electronic device 21. The electronic device 21 includes the electronic component mounting board 1 and the electronic component 10 mounted on the electronic component mounting board 1.

The electronic device 21 includes the electronic component mounting board 1 and the electronic component 10 mounted on the electronic component mounting board 1. The electronic component 10 is, for example, an imaging device such as a charge-coupled device (CCD) or a complementary metal oxide semiconductor (CMOS) device, a light-emitting device such as a light emitting diode (LED), or an integrated circuit such as a large-scale integrated circuit (LSI). The electronic component 10 may be mounted on the upper surface of the substrate 2 with an adhesive. The adhesive is, for example, silver epoxy or a thermosetting resin.

The electronic device 21 may include a lid 12 that covers the electronic component 10 and is bonded to the upper surface of the electronic component mounting board 1. In this structure, the electronic component mounting board 1 may comprise the lid 12 connected to the upper surface of a frame portion in the substrate 2, or include a frame that supports the lid 12 and surrounds the electronic component 10 on the upper surface of the substrate 2. The frame may be formed from the same material as or a material different from the material for the substrate 2.

When the frame and the substrate 2 comprised the same material, they may be formed integrally with the uppermost insulating layer, with the frame on the substrate 2 having an opening. In another embodiment, they may be bonded together with a separately bonded brazing material.

When the substrate 2 and the frame comprised different materials, the frame may be formed from, for example, the same material as the material for a lid bond 14 for bonding the lid 12 to the substrate 2. In this case, the lid bond 14 is thick enough to function both as a bonding member and a frame (as a support for the lid 12). Examples of the lid bond 14 include a thermosetting resin and a brazing material comprised glass with a low melting point or a metal component. The frame and the lid 12 may be formed from the same material. In this case, the frame and the lid 12 may be formed as one piece.

The lid 12 is a highly transparent member comprised, for example, a glass material when the electronic component 10 is an imaging device such as a CMOS and CCD, or a light-emitting device such as an LED. The lid 12 may be formed from a metallic material or an organic material when the electronic component 10 is an integrated circuit.

The lid 12 is bonded to the electronic component mounting board 1 with the lid bond 14. Examples of the material for the lid bond 14 include a thermosetting resin and a brazing material comprised glass with a low melting point or a metal component.

The electronic device 21 includes the electronic component mounting board 1 shown in FIGS. 1A to 3B to improve electrical characteristics.

Electronic Module Structure

FIGS. 3A and 3B show an example of an electronic module 31 including the electronic component mounting board 1. The electronic module 31 includes the electronic device 21 and a housing 32 either located on the upper surface of the electronic device 21 or covering the electronic device 21. In the example described below, the electronic module 31 is, for example, an imaging module.

The electronic module 31 comprises the housing 32 (lens holder). The housing 32 improves hermetical sealing and reduces the electronic device 21 from directly receiving external stress. The housing 32 comprised, for example, a resin or metal material. The lens holder as the housing 32 may incorporate one or more lenses comprised, for example, a resin, a liquid, glass, or quartz. The housing 32 may include, for example, a drive for vertical or horizontal driving, and may be electrically connected to the electronic component mounting board 1.

The housing 32 may comprise an opening in at least one of the four sides as viewed from above. Through the opening in the housing 32, an external circuit board may be placed for electrical connection to the electronic component mounting board 1. After the external circuit board is electrically connected to the electronic component mounting board 1, the opening in the housing 32 may be sealed with a sealant, such as a resin, to hermetically seal the inside of the electronic module 31.

Method for Manufacturing Electronic Component Mounting Board and Electronic Device An example method for manufacturing the electronic component mounting board 1 and the electronic device 21 according to the present embodiment will now be described with reference to FIGS. 4A to 5B.

The electronic component mounting board 1 may be manufactured with a manufacturing method including (1) preparing a first insulating sheet 42a and a second insulating sheet 42b that are to be stacked on each other, (2) applying a first wire paste 45a onto the upper surface of the second insulating sheet 42b, (3) applying a second wire paste 45b onto the upper surface of the second insulating sheet 42b with a space left from the first wire paste 45a, (4) filling the space between the first wire paste 45a and the second wire paste 45b with a first insulating paste 46a and covering the upper surface of the first wire paste 45a and the upper surface of the second wire paste 45b with the first insulating paste 46a, and (5) stacking the first insulating sheet 42a on the upper surface of the second insulating sheet 42b to form a laminate 42. These processes may not be performed in the order of numbering, and may be performed in different orders. Two or more of the above processes may be performed together.

The electronic component mounting board 1 including resin insulating sheets may be manufactured with the method described below. First, the resin insulating layers formed from a selected resin are prepared as the first insulating sheet 42a and the second insulating sheet 42b.

To form the additional insulating layer 2f in the electronic component mounting board 1, a resin layer to be the additional insulating layer 2f is also formed in the same manner as for the other insulating layers. A metal material (to be the first wire paste 45a, the second wire paste 45b, and additional metal pastes) is then applied or placed, by screen printing, etching, plating, or other techniques, into the areas to be the first wire 5a, the second wire 5b, the electrodes 3, the pads, the inner wires, and the feedthrough conductors in the first insulating sheet 42a, the second insulating sheet 42b, and the additional insulating sheet 42c obtained through the above process (1).

Subsequently, a resist layer to be the first insulating paste 46a is printed, applied, or bonded into a predetermined area. The layers are then heated and laminated to form the laminate 42, which is to be the resin mounting board 1 for an electronic component.

The first insulating sheet 42a and/or the second insulating sheet 42b in the electronic component mounting board 1 is a ceramic green sheet mainly containing a ceramic material. The first insulating paste 46a is a ceramic paste mainly containing a ceramic material. The manufacturing method may further include (6) firing the laminate 42.

A method for manufacturing a main part of the electronic component mounting board according to the present embodiment will now be described. An example manufacturing method described below uses a ceramic green sheet mainly containing a ceramic material that serves as an insulating sheet, and uses a multi-piece wiring substrate to be cut into the substrates 2.

Figure 4A:
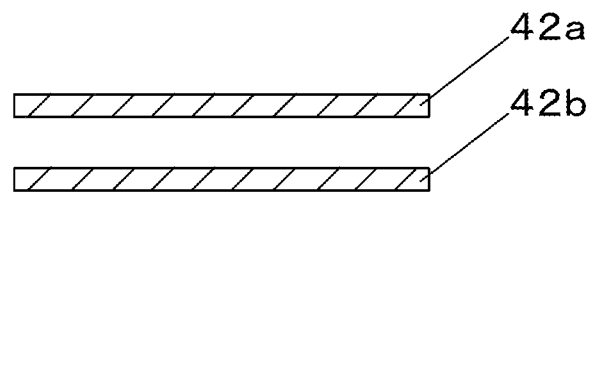
FIGS. 4A to 4C are schematic diagrams showing processes for manufacturing a main part of the electronic component mounting board according to the first embodiment.

The manufacturing processes for the electronic component mounting board 1 include (1) preparing the first insulating sheet 42a and the second insulating sheet 42b that are to be stacked on one another as in the example shown in FIG. 4A. The insulating layers to be the electronic component mounting board 1 may be formed from, for example, sintered aluminum oxide ($Al_2O_3$). To obtain the first insulating sheet 42a and the second insulating sheet 42b formed from sintered aluminum oxide ($Al_2O_3$), powders of, for example, silica ($SiO_2$), magnesia (MgO), and calcium oxide (CaO), are added as a sintering aid to $Al_2O_3$ powder, and an appropriate binder, an appropriate solvent, and an appropriate plasticizer are added to the powder mixture, which is then kneaded to form slurry.

The slurry is then shaped into sheets using a doctor blade or calendaring to obtain the first insulating sheet 42a and the second insulating sheet 42b for forming a multi-piece substrate including an array of substrates. To form the additional insulating layer 2f in the electronic component mounting board 1, an insulating sheet to be the additional insulating layer 2f is also formed in the same manner as for other insulating layers.

Figure 4B:
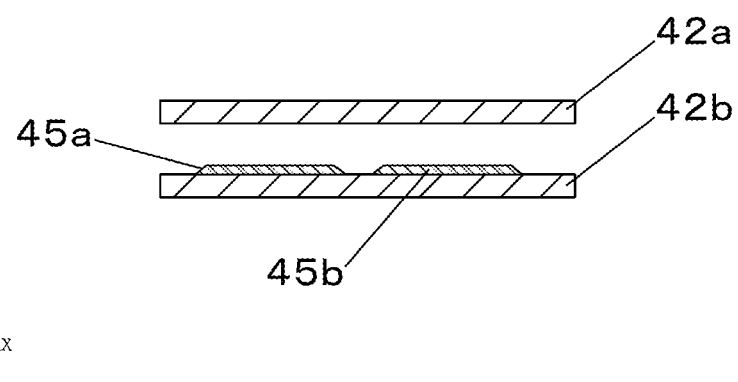

The manufacturing processes for the electronic component mounting board 1 include (2) applying the first wire paste 45a onto the upper surface of the second insulating sheet 42b as in the example shown in FIG. 4B. The manufacturing processes for the electronic component mounting board 1 include (3) applying the second wire paste 45b onto the upper surface of the second insulating sheet 42b with a space left from the first wire paste 45a as in the example shown in FIG. 4B.

A metal paste (to be the first wire paste 45a, the second wire paste 45b, and the additional metal pastes) is then applied or placed, by screen printing or other techniques, into the areas to be the first wire 5a, the second wire 5b, the electrodes 3, the pads, the inner wires, and the feedthrough conductors in the first insulating sheet 42a, the second insulating sheet 42b, and the additional insulating sheet 42c obtained through the above process (1). The metal paste may be prepared by adding an appropriate organic binder and an appropriate solvent to the metal powder, kneading the mixture using, for example, a ball mill or a planetary mixer, to homogeneously disperse the metal powder, and then adding an appropriate amount of solvent to comprise a viscosity suitable for printing or filling through-holes.

The metal powder is to be fired together with the first insulating sheet 42a, the second insulating sheet 42b, and the additional insulating sheet 42c for sintering in the subsequent firing process. The metal powder contains one or more of, for example, tungsten (W), molybdenum (Mo), manganese (Mn), gold, (Au), silver (Ag), copper (Cu), palladium (Pd), and platinum (Pt). The metal powder containing two or more of these metals may be in the form of a mixture, an alloy, or a coating. The metal paste may contain glass or ceramic to increase the strength of bonding with the first insulating sheet 42a, the second insulating sheet 42b, and the additional insulating sheet 42c.

The processes (2) and (3) may be performed together or separately. In the processes (2) and (3) combined together, the first wire paste 45a and the second wire paste 45b can be applied using the same mask and printed by, for example, screen printing. This reduces misalignment between the first wire paste 45a and the second wire paste 45b, and thus reduces short-circuiting between the first wire paste 45a and the second wire paste 45b further.

In the separate processes (2) and (3), either the first wire paste 45a or the second wire paste 45b is printed on the lower surface of the first insulating sheet 42a or the upper surface of the second insulating sheet 42b in one process, and the other paste 45a or 45b is printed on the surface of the other sheet 42a or 42b in the other process. In some embodiments, the first wire paste 45a and the second wire paste 45b to be on the same surface may be printed to comprise different thicknesses through such separate processes.

This method allows stress generated from printing of the first wire paste 45a and the second wire paste 45b to be received partly by the first insulating sheet 42a and partly by the second insulating sheet 42b. This method can form the first wire paste 45a and the second wire paste 45b with different thicknesses and thus allows one wire to comprise a lower resistance. This improves the electrical characteristics.

The method may further include, either before the process (2) and/or the process (3) or together with the process (2) and/or the process (3), processing the first insulating sheet 42a, the second insulating sheet 42b, and/or the additional insulating sheet 42c using a mold for example. This processing may form an opening in the center of an insulating sheet for receiving the electronic component 10 or may form a through-hole in an area to be a feedthrough conductor for vertically conducting layers. This process using a mold may be performed after the stacking process (described later) or may be performed as parts of other processes. The insulating sheets may be processed by laser processing or by etching, instead of using a mold as described above.

Figure 4C:
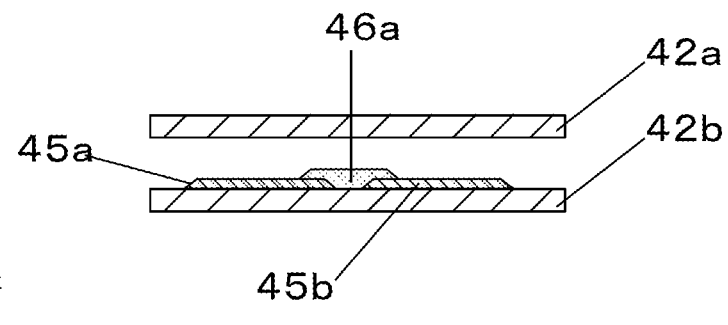

The manufacturing processes for the electronic component mounting board 1 include (4) filling the space between the first wire paste 45a and the second wire paste 45b with the first insulating paste 46a and covering the upper surface of the first wire paste 45a and the upper surface of the second wire paste 45b with the first insulating paste 46a as in the example shown in FIG. 4C. The first insulating paste 46a may be prepared by adding an appropriate organic binder and an appropriate solvent to the ceramic powder used to form the first insulating sheet 42a, the second insulating sheet 42b, and the additional insulating sheet 42c, kneading the mixture using, for example, a ball mill or a planetary mixer to homogeneously disperse the ceramic powder, and then adding an appropriate amount of solvent to adjust the viscosity. The first insulating paste 46a may be applied by, for example, screen printing similarly to the first wire paste 45a and the second wire paste 45b.

The first insulating paste 46a may be applied on the first wire paste 45a and the second wire paste 45b that have been applied onto the insulating sheets in the processes (2) and (3). In some embodiments, the first insulating paste 46a may be printed on the lower surface of the first insulating sheet 42a after the first wire paste 45a and the second wire paste 45b are applied to the upper surface of the second insulating sheet 42b. In the stacking process described later, the first insulating paste 46a is applied to fill between the first wire paste 45a and the second wire paste 45b and cover the upper surface of the first wire paste 45a and the upper surface of the second wire paste 45b.

Figure 5A:
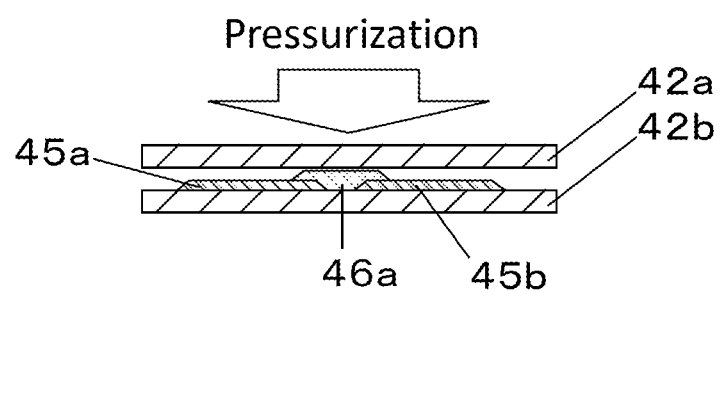
FIGS. 5A and 5B are schematic diagrams showing processes for manufacturing the main part of the electronic component mounting board according to the first embodiment.
Figure 5B:
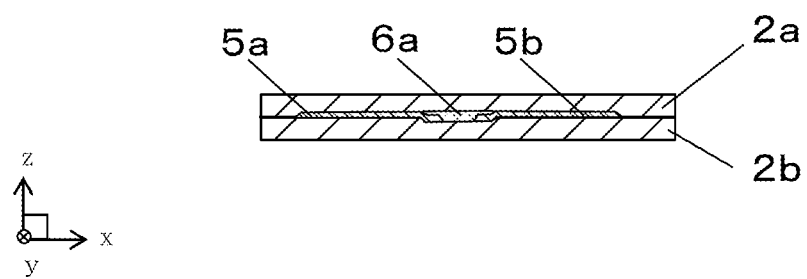

The manufacturing processes for the electronic component mounting board 1 include (5) stacking the first insulating sheet 42a on the upper surface of the second insulating sheet 42b to form a laminate 42 as in the example shown in FIGS. 5A and 5B. In this process, a liquid for laminating the sheets is applied onto the lower surface of the first insulating sheet 42a or the upper surface of the second insulating sheet 42b. This lamination liquid may be applied in an area excluding the first wire paste 45a, the second wire paste 45b, and the additional metal pastes. This reduces the first wire paste 45a, the second wire paste 45b, and the additional metal pastes from extending by absorbing the lamination liquid, and thus more effectively reduces short-circuiting between the first wire paste 45a, the second wire paste 45b, and the additional metal pastes. In some embodiments, the lamination liquid may be applied in an area including the first wire paste 45a, the second wire paste 45b, and the additional metal pastes to further improve the adhesion of the laminate.

After the lamination liquid is applied as appropriate, the first insulating sheet 42a, the second insulating sheet 42b, and the additional insulating sheet 42c are stacked on one another and pressed together. This forms the laminate of insulating sheets, which are to be the substrate 2 (electronic component mounting board 1).

The manufacturing processes for the electronic component mounting board 1 include (6) firing the laminate 42. The insulating sheet laminate to be the substrate 2 is then fired at, for example, about 1,500 to 2,000° C. to obtain a multi-piece wiring substrate including am array of substrates 2 (electronic component mounting boards 1). In this process, the first wire paste 45a, the second wire paste 45b, and the additional metal pastes described above are fired together with the insulating sheets to be the substrates 2 (electronic component mounting boards 1) to form the first wires 5a, the second wires 5b, the electrodes 3, the pads, the inner wires, and the feedthrough conductors.

The multi-piece wiring substrate resulting from the firing process is then cut into a plurality of substrates 2 (electronic component mounting boards 1). In this cutting process, separation grooves may be formed along the outer edge of each of the substrates 2 (electronic component mounting boards 1), and the multi-piece wiring substrate may be split along the separation grooves into the plurality of substrates 2 (electronic component mounting boards 1).

The separation grooves may be formed to comprise a depth smaller than the thickness of the multi-piece wiring substrate using a dicer after the firing process. In some embodiments, the separation grooves may be formed by pressing a cutter blade onto the insulating sheet laminate that is to be the multi-piece wiring substrate or by cutting the insulting sheet laminate to a depth smaller than its thickness with a dicer. In other embodiments, the separation grooves may not be formed, and the multi-piece wiring substrate may be cut into a plurality of substrates 2 (electronic component mounting boards 1) by dicing or using a laser beam. Before or after the multi-piece wiring substrate is split into a plurality of substrates 2 (electronic component mounting boards 1), the electrodes 3, the pads, and the uncovered wiring conductors may be plated by electro-plating or electroless plating.

The electronic component 10 is then mounted on the electronic component mounting board 1. The electronic component 10 is electrically connected to the electronic component mounting board 1 using, for example, bonding wires, gold bumps, or solder balls. In some embodiments, the electronic component 10 may be fixed onto the electronic component mounting board 1 by applying an adhesive or another bond to the electronic component 10 or to the electronic component mounting board 1. After the electronic component 10 is mounted on the electronic component mounting board 1, the lid 12 may be bonded to the electronic component mounting board 1 with the lid bond 14.

The manufacturing method according to the present embodiment includes filling the space between the first wire paste 45a and the second wire paste 45b with the first insulating paste 46a. This reduces short-circuiting between the first wire paste 45a and the second wire paste 45b due to the pastes containing the adhesive liquid and/or due to the pressure applied during the stacking process.

Second Embodiment

An electronic component mounting board 1 according to a second embodiment of the present invention will now be described with reference to FIGS. 6A to 9B. The electronic component mounting board 1 according to the present embodiment differs from the electronic component mounting board 1 according to the first embodiment in that the first metal layer 5 includes a first portion 8a located parallel to the mount area 4, a second portion 8b located at an end and above or below the first portion 8a, and a first slope 8c extending between the first portion 8a and the second portion 8b.

In the examples shown in FIGS. 6A to 9B, the electronic component mounting board 1 includes the first metal layer 5 including the first portion 8a located parallel to the mount area 4, the second portion 8b located at the end of the first metal layer 5 and above or below the first portion 8a, and the first slope 8c extending between the first portion 8a and the second portion 8b in its cross-sectional view. In the examples shown in FIGS. 6A to 7B, the second portion 8b is located between the first wire 5a and the second wire 5b.

Being parallel to the mount area 4 in the cross-sectional view herein refers to being substantially parallel to comprise an extension of the first portion 8a without touching an extension of an imaginary plane of the mount area 4 inside the outer edge of the substrate 2, and includes slightly being inclined due to process errors during manufacture. The imaginary plane is a plane obtained by calculating the height positions of the inner ends of the plurality of electrodes 3 in z-direction with the least square method.

In the present embodiment, the first slope 8c having a z-direction component of the substrate 2 and the second portion 8b located below or above the first portion 8a are between adjacent first and second wires 5a and 5b. This structure allows the second portion 8b and the first slope 8c to function as a shield. The shield effectively reduces electromagnetic noise generated between adjacent metallized portions, and thus reduces electromagnetic noise propagating to the first wire 5a and the second wire 5b when the adjacent metallized portions are close to each other.

The first slope 8c, which has the z-direction component of the substrate 2, and the second portion 8b, which is located below or above the first portion 8a, are between the first wire 5a and the second wire 5b to reflect electromagnetic noise generated in each of the first wire 5a and the second wire 5b inward from the first slope 8c. This reduces electromagnetic noise leaking from the first wire 5a and the second wire 5b and propagating to adjacent first and second wires 5a and 5b.

The electronic component mounting board 1 that has recently been thinner includes thinner insulating layers. The first metal layer 5 with the first slope 8c can increase its dimension in z-direction to further improve shielding against electromagnetic noise.

As in the examples shown in FIGS. 6A to 7B, the first metal layer 5 may include the second portion 8b and the first slope 8c overlapping the mount area 4. More specifically, the second portion 8b and the first slope 8c in each of the first wire 5a and the second wire 5b may overlap the mount area 4 as viewed from above in the examples shown in FIGS. 6A to 7B. This structure provides a heat dissipation path for heat generated from the electronic component 10 during operation. In other words, when the second portion 8b is away from the mount area 4, the first portion 8a receives and releases heat away through the first slope 8c. When the second portion 8b is nearer the mount area 4, the second portion 8b receives and releases heat away through the first slope 8c. This improves heat dissipation from the electronic component mounting board 1.

The first metal layer 5 (the first wire 5a and the second wire 5b) may not be electrically connected to any signal line, but may be electrically connected to a ground potential. The first metal layer 5 having at least one of the first wire 5a and the second wire 5b electrically connected to a ground potential enable more effective shielding of the first metal layer 5 (the first wire 5a and the second wire 5b). This structure is less susceptive to electromagnetic noise. The first wire 5a and the second wire 5b each may be electrically connected to a different ground potential to reduce generation of electromagnetic noise generation due to mutual interaction and also to further improve their shielding against external electromagnetic noise.

The first portion 8a in the first metal layer 5 (the first wire 5a and the second wire 5b) located parallel to the mount area 4 may be located at any other positions between the first insulating layer 2a and the second insulating layer 2b. For example, the first portion 8a may extend across substantially the entire substrate 2 or partially along the substrate 2 in the cross-sectional view. The first portion 8a may comprise any size. For example, the first portion 8a may comprise a length of at least about 150 μm in x-direction in the cross-sectional view.

In the examples shown in FIGS. 6A to 7B, the second portion 8b in the first metal layer 5 (the first wire 5a and the second wire 5b) is located between the first wire 5a and the second wire 5b. The second portion 8b may be located at another position. In other words, the first metal layer 5 (the first wire 5a and the second wire 5b) may comprise another second portion 8b near the outer ends in the cross-sectional view. The second portion 8b may comprise a length of at least 30 μm in x-direction in the cross-sectional view.

The first slope 8c in the first metal layer 5 (the first wire 5a and the second wire 5b) comprises a length in z-direction of about 10 to 40% of the thickness of the first insulating layer 2a or the second insulating layer 2b. More specifically, when the first insulating layer 2a or the second insulating layer 2b comprises a thickness of 35 μm, the first slope 8c comprises a length in z-direction of about 3.5 to 14 μm. The first slope 8c with the specified length comprises a sufficiently large component in z-direction, and enables more effective shielding. The first slope 8c with a greater length in z-direction enables more effective shielding.

The first metal layer 5 (the first wire 5a and the second wire 5b) may be at a position overlapping the wires that can readily serve as antennas for electromagnetic noise, such as mobile industry processor interface (MIPI) wires and signal wires, or wires that are susceptive to noise components as viewed from above. The first metal layer 5 overlapping those wires as viewed from above locally enables more effective shielding. This structure enables more effective shielding of the wires that can readily serve as antennas for electromagnetic noise or the wires susceptive to noise components.

The second portion 8b and the first slope 8c in the first metal layer 5 (the first wire 5a and the second wire 5b) may be located at least between adjacent first and second wires 5a and 5b, or may be located along the entire perimeter of the first portion 8a. The second portion 8b and the first slope 8c in the first metal layer 5 (the first wire 5a and the second wire 5b) located along the entire perimeter of the first portion 8a further improve shielding against electromagnetic noise generated by electromagnetic induction external to the substrate 2.

In the examples shown in FIGS. 6A to 7B, the second portions 8b between the first wire 5a and the second wire 5b are oriented in the same direction (or below the first portion 8a herein). In some embodiments, the second portion 8b in one of the metalized portions may be located above the first portion 8a. This structure provides different shielding directions, and thus enables more effective shielding of the first wire 5a and the second wire 5b. The structure is thus less susceptive to electromagnetic noise.

Figure 7A:
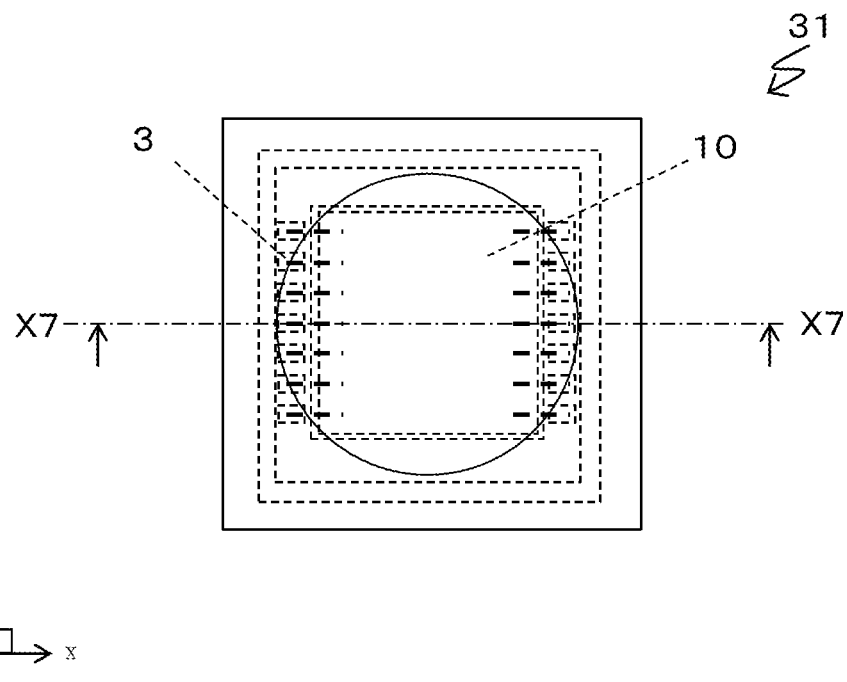
FIG. 7A is an external top view of an electronic component mounting board, an electronic device, and an electronic module according to a modification of the second embodiment of the present invention.
Figure 7B:
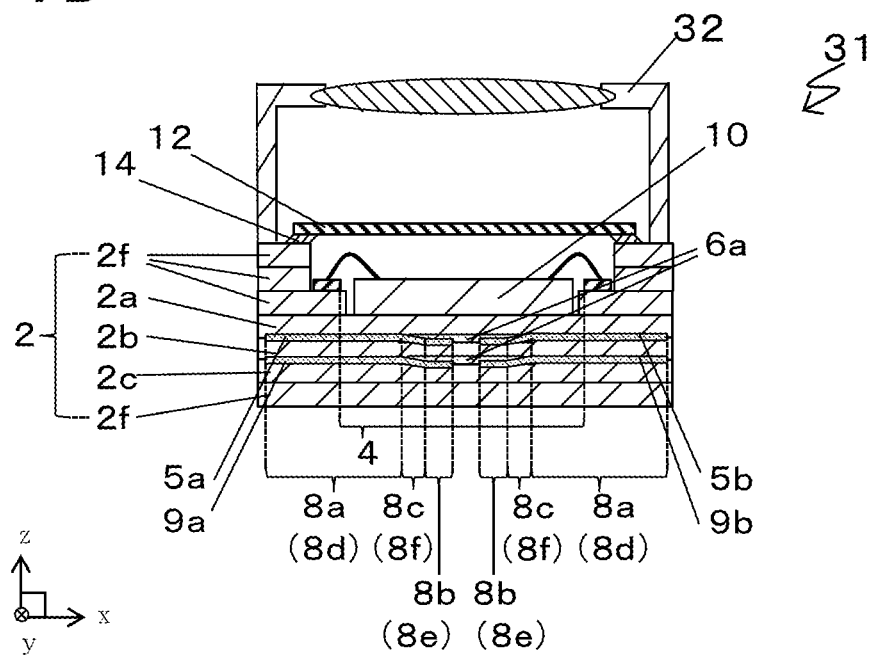
FIG. 7B is a cross-sectional view taken along line X7-X7 in FIG. 7A.

FIGS. 7A and 7B show a modification of the present embodiment. The structure shown in FIGS. 7A and 7B includes a second metal layer 9 on the lower surface of the second insulating layer 2b. Similarly to the first metal layer 5, the second metal layer 9 may include a third wire 9a and a fourth wire 9b spaced from the third wire 9a. The electronic component mounting board 1 includes a third insulating layer 2c located on the lower surface of the second metal layer 9. In the cross-sectional view, the electronic component mounting board 1 includes the second metal layer 9, which includes the first portion 8a (third portion 8d) located parallel to the mount area 4, the second portion 8b (fourth portion 8e) located below the first portion 8a (third portion 8d), and the first slope 8c (second slope 8f) extending between the first portion 8a (third portion 8d) and the second portion 8b (fourth portion 8e). The names in parentheses are used when the first metal layer 5 includes the first portion 8a, the second portion 8b, and the first slope 8c. The first metal layer 5 and the second metal layer 9 overlap each other as viewed from above to upsize the shielding wall in a pseudo manner. This reduces electromagnetic noise leakage as well as propagating external electromagnetic noise. The structure is thus less susceptive to electromagnetic noise.

The electronic component mounting board 1 may comprise at least one set selected from the second portion 8b and the fourth portion 8e, the first portion 8a and the fourth portion 8e, and the second portion 8b and the third portion 8d comprise an overlap between the portions. In the example shown in FIGS. 7A and 7B, the second portion 8b in the first metal layer 5 and the second portion 8b (fourth portion 8e) in the second metal layer 9 overlap each other. This structure maintains an insulating gap between the second portion 8b in the first metal layer 5 and the second portion 8b (fourth portion 8e) in the second metal layer 9. This structure reduces electromagnetic noise that can be generated when the second portion 8b in the first metal layer 5 and the second portion 8b (fourth portion 8e) in the second metal layer 9 interfere with each other.

Although the first metal layer 5 and the second metal layer 9 overlap completely in the example shown in FIGS. 7A and 7B, the layers may be located at different positions in the cross-sectional view. The material, the potential to which the second metal layer 9 is connected, and other details of the second metal layer 9 are similar to those of the first metal layer 5 described in the first embodiment, and thus are not repeated.

Method for Manufacturing Electronic Component Mounting Board and Electronic Device An example method for manufacturing the electronic component mounting board 1 and the electronic device 21 according to the present embodiment will now be described with reference to FIGS. 8A to 9B. The method for manufacturing the electronic component mounting board 1 and the electronic device 21 according to the present embodiment is basically similar to the manufacturing method described in the first embodiment. The processes associated with the first metal layer 5 and the second metal layer 9 will be described.

Figure 8A:
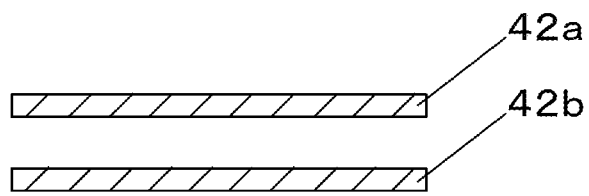
FIGS. 8A to 8C are schematic diagrams showing processes for manufacturing a main part of the electronic component mounting board according to the second embodiment.
Figure 8B:
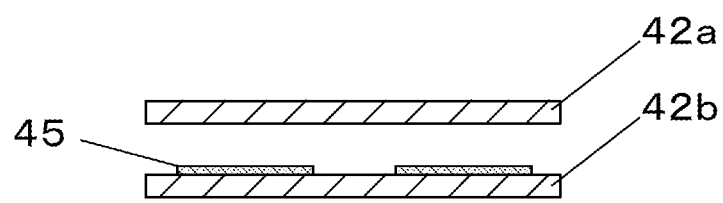
Figure 8C:
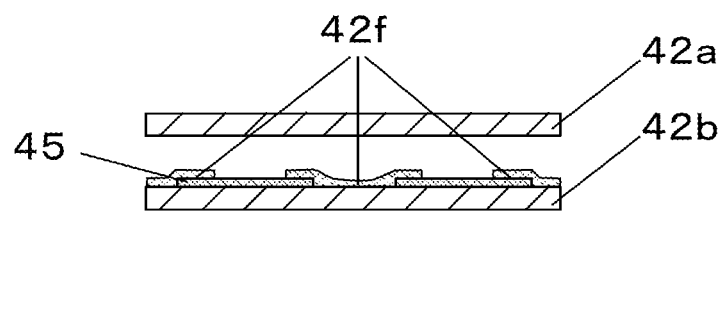
Figure 9A:
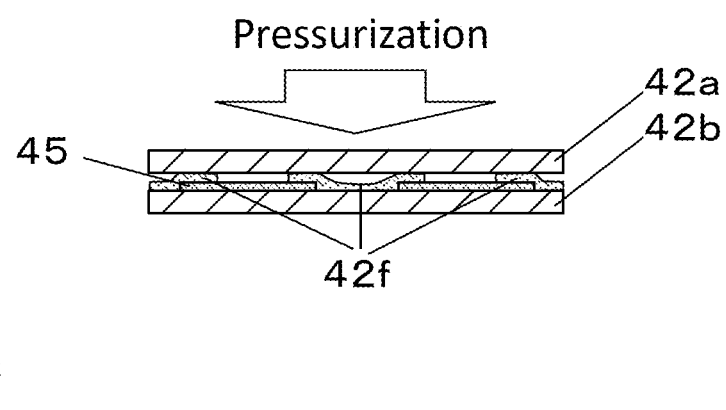
FIGS. 9A and 9B are schematic diagrams showing processes for manufacturing the main part of the electronic component mounting board according to the second embodiment.
Figure 9B:
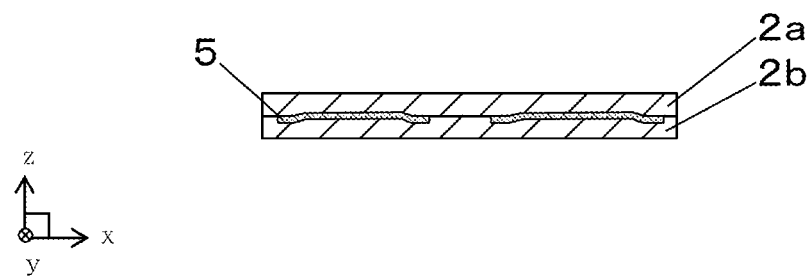

The second portion 8b (fourth portion 8e) in the first metal layer 5 (the first wire 5a and the second wire 5b) and/or in the second metal layer 9 (the third wire 5c and the fourth wire 5d) may be formed by successively applying the single ceramic paste 42f as in the example shown in FIG. 8C. The ceramic paste fills the space between the adjacent metalized portions, in addition to forming the second portion 8b (fourth portion 8e) in the first metal layer 5 (the first wire 5a and the second wire 5b) and/or in the second metal layer 9 (the third wire 5c and the fourth wire 5d). This reduces the metal paste from spreading in the stacking process, and causing short-circuiting between the adjacent metalized portions.

The second portion 8b (fourth portion 8e) and the first slope 8c (second slope 8f) may be formed with a method other than the manufacturing method illustrated above. For example, a first ceramic green sheet 42a or a second ceramic green sheet 42b may be pressed with, for example, a mold, to form a recess, into which a metal paste 45 is printed or applied to form the second portion 8b and the first slope 8c. In some embodiments, the first ceramic green sheet 42a or the second ceramic green sheet 42b may be coated with the metal paste 45, and then pressed with, for example, a mold to form the second portion 8b (fourth portion 8e) and the first slope 8c (second slope 8f).

Third Embodiment

An electronic component mounting board 1 according to a third embodiment of the present invention will now be described with reference to FIG. 10. The electronic component mounting board 1 according to the present embodiment differs from the electronic component mounting board 1 according to the second embodiment in that the first portion 8a in the first metal layer 5 overlaps the second portion 8b (fourth portion 8e) in the second metal layer 9 as viewed from above.

Figure 10:
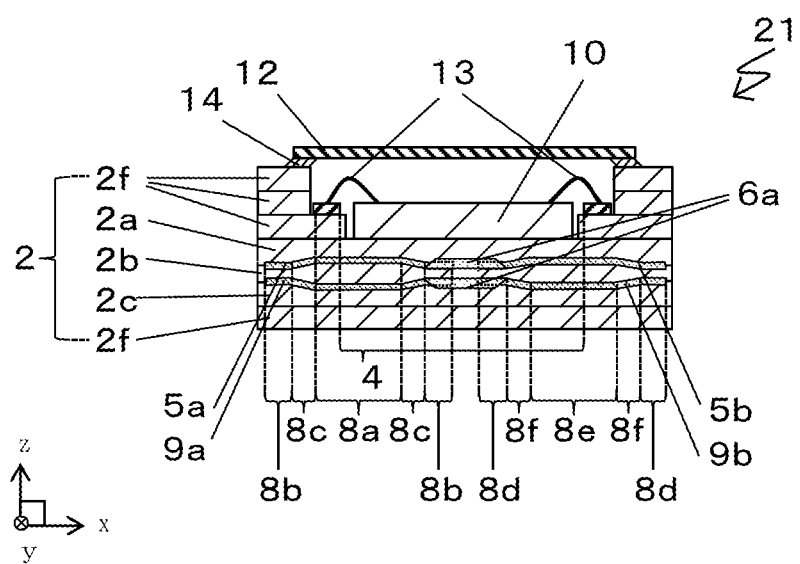
FIG. 10 is a cross-sectional view of an electronic component mounting board and an electronic device according to a third embodiment of the present invention.

In the example shown in FIG. 10, the first portion 8a in the first metal layer 5 and the second portion 8b (fourth portion 8e) in the second metal layer 9 overlap each other as viewed from above. This structure allows adjustment of the distance between the first portion 8a in the first metal layer 5 and the second portion 8b (fourth portion 8e) in the second metal layer 9. This structure thus allows adjustment of the impedance for the first portion 8a in the first metal layer 5 and the second portion 8b (fourth portion 8e) in the second metal layer 9 having different wires, while providing the advantages according to one or more embodiments of the present invention.

In the example shown in FIG. 10, the second portion 8b in the first metal layer 5 and the first portion 8a (third portion 8d) in the second metal layer 9 overlap each other as viewed from above. This structure shortens the distance between the second portion 8b in the first metal layer 5 and the first portion 8a (third portion 8d) in the second metal layer 9 in the cross-sectional view. The shorter distance further narrows the entrance or the exit for electromagnetic noise and enable more effective shielding to reduce electromagnetic noise affecting the area defined by the first portion 8a and the fourth portion 8e. This reduces propagating external electromagnetic noise affecting the area defined by the first metal layer 5 and the second metal layer 9 included in the substrate 2, reduces electromagnetic noise leakage outside, and reduces electromagnetic noise generated between the first wire 5a and the second wire 5b or between the third wire 9a and the fourth wire 9b.

Although the first metal layer 5 and the second metal layer 9 overlap completely in the example shown in FIG. 10, the layers may be located at different positions in the cross-sectional view.

Fourth Embodiment

Figure 11A:
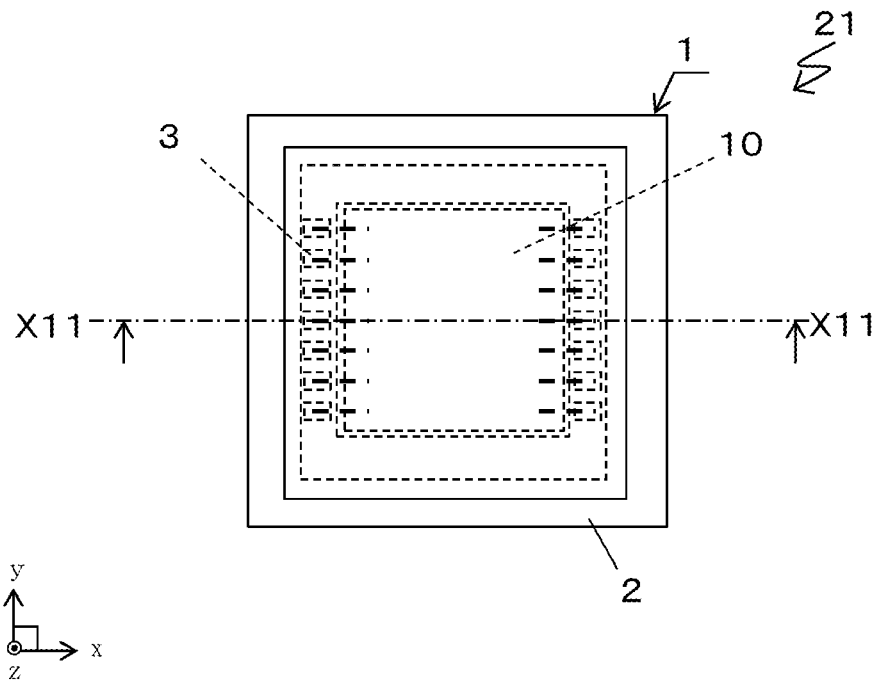
FIG. 11A is an external top view of an electronic component mounting board and an electronic device according to a fourth embodiment of the present invention.
Figure 11B:
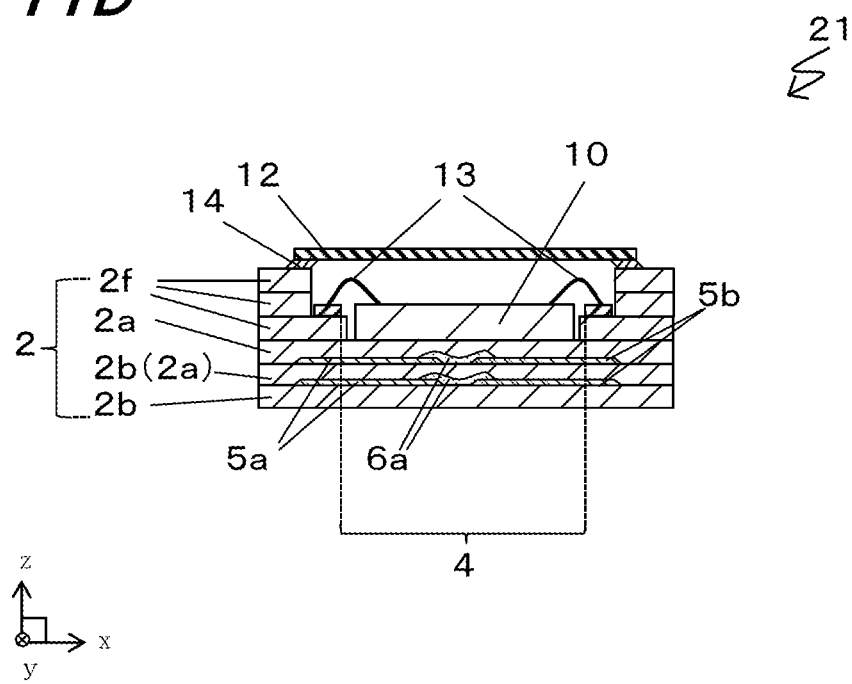
FIG. 11B is a cross-sectional view taken along line X11-X11 in FIG. 11A.
Figure 12A:
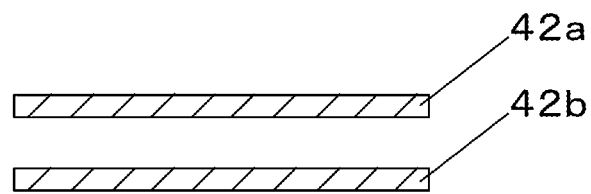
FIGS. 12A to 12C are schematic diagrams showing processes for manufacturing a main part of the electronic component mounting board according to the fourth embodiment.
Figure 12B:
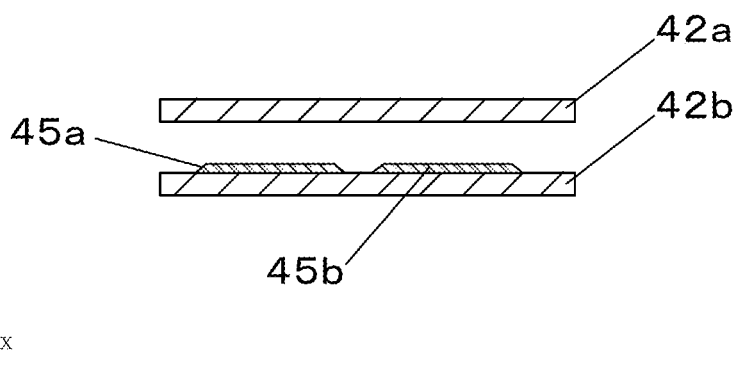
Figure 12C:
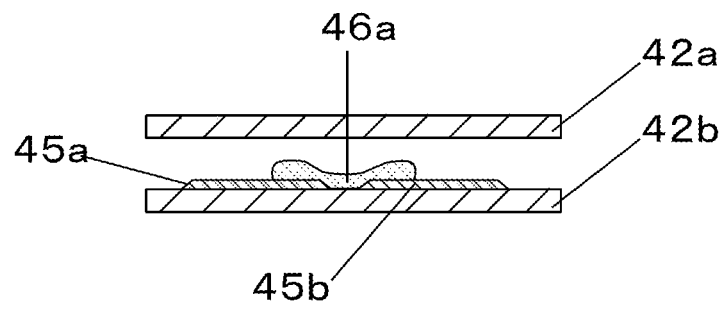
Figure 13A:
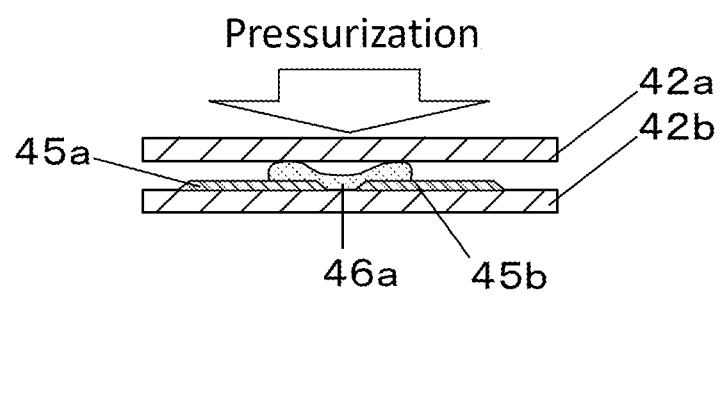
FIGS. 13A and 13B are schematic diagrams showing processes for manufacturing the main part of the electronic component mounting board according to the fourth embodiment.
Figure 13B:
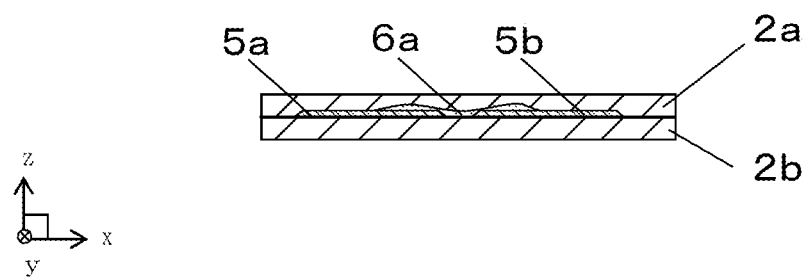

An electronic component mounting board 1 and a method for manufacturing the electronic component mounting board 1 according to a fourth embodiment of the present invention will now be described with reference to FIGS. 11A to 13B. FIGS. 11A and 11B show the structures of the electronic component mounting board 1 and the electronic device 21 according to the present embodiment, and FIGS. 12A to 13B are schematic diagrams describing a method for manufacturing a main part of the electronic component mounting board 1 according to the fourth embodiment. The electronic component mounting board 1 according to the present embodiment differs from the electronic component mounting board 1 according to the first embodiment in that the first insulating film 6a comprises a different shape in the cross-sectional view.

In the example shown in FIGS. 11A and 11B, the electronic component mounting board 1 includes the first insulating film 6a, which comprises a recess in the center of the space between the first wire 5a and the second wire 5b in the cross-sectional view. The first insulating film 6a having the recess in the center of the first insulating film 6a as in the example shown in FIGS. 11A and 11B provides the advantages of the embodiments of the present invention when the first insulating film 6a covers the ends of the first wire 5a and the second wire 5b.

As in the example shown in FIGS. 11A and 11B, the center recess in the first insulating film 6a in the electronic component mounting board 1 can receive the first insulating layer 2a. This structure can reduce the thickness of the electronic component mounting board 1.

In this structure, the first insulating layer 2a or the second insulating layer 2b can accommodate the thicknesses and the shapes of the first wire 5a, the second wire 5b, and the first insulating film 6a to reduce the electronic component mounting board 1 from having unsmooth surface equilibrium. This enables stable mounting of the electronic component 10.

FIGS. 12A to 13B are schematic diagrams describing a method for manufacturing a main part of the electronic component mounting board 1 according to the present embodiment. The method for manufacturing the main part in FIGS. 12A to 13B includes the process for applying a first insulating paste 46a to form a recess between the first wire paste 45a and the second wire paste 45b in the cross-sectional view. The first insulating paste 46a applied in this manner comprises the recess for receiving the first insulating sheet 42a in the stacking process shown in FIG. 13A. The resultant electronic component mounting board 1 having the structure shown in FIGS. 11A and 11B is less likely to comprise unsmooth surface equilibrium. This enables stable mounting of the electronic component 10.

As in the example shown in FIGS. 12A to 13B, the first insulating paste 46a may be applied by screen printing by adjusting the pressure of a squeegee, or by changing the material used for a mask to a softer material. In some embodiments, the first insulating paste 46a may be printed twice to form the recess.

As in the example shown in FIGS. 11A to 13B, the first insulating film 6a may comprise round edges. The round edges in the first insulating film 6a (first insulating paste 46a) allow less stress concentration during the stacking process, and thus reduce cracks or breaks in the first insulating film 6a (first insulating paste 46a).

As in the example shown in FIGS. 12A to 13B, the first insulating paste 46a may extend laterally in the cross-sectional view under stress applied in the stacking process. This structure can reduce the thickness of the first insulating paste 46a on the upper surfaces of the first wire paste 45a and the second wire paste 45b, and thus can reduce local differences in the cross-sectional view. The resultant electronic component mounting board 1 is less likely to comprise unsmooth surface equilibrium, and enables stable mounting of the electronic component 10.

Fifth Embodiment

An electronic component mounting board 1 according to a fifth embodiment of the present invention will now be described with reference to FIGS. 14A and 14B. The electronic component mounting board 1 according to the present embodiment differs from the electronic component mounting board 1 according to the first embodiment in that the electronic component mounting board 1 includes a second insulating film 6b and that the first insulating film 6a and/or the second insulating film 6b are located at different positions between multiple layers as viewed from above.

Figure 14A:
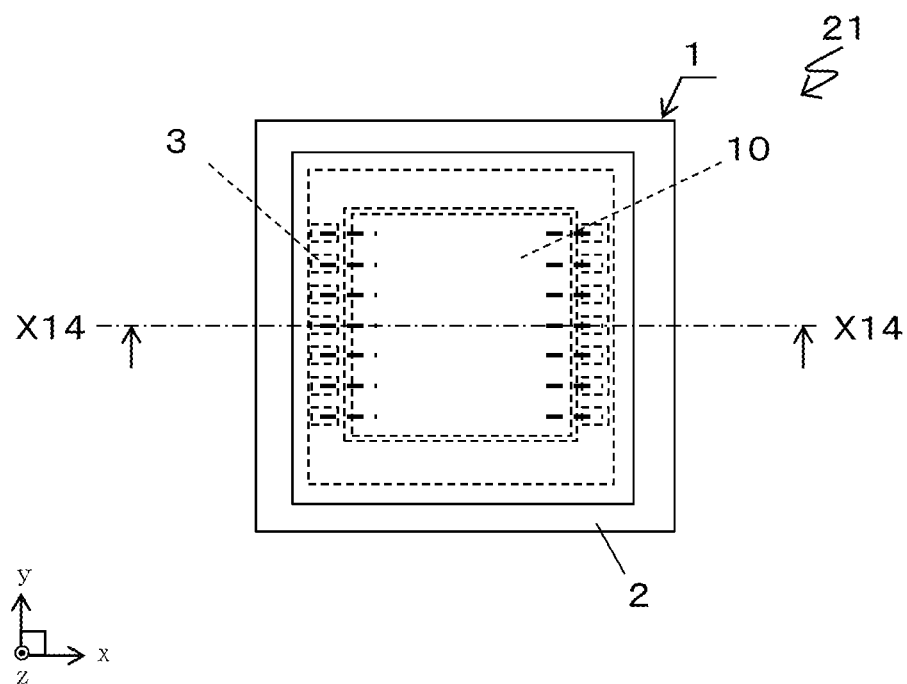
FIG. 14A is an external top view of an electronic component mounting board and an electronic device according to a fifth embodiment of the present invention.
Figure 14B:
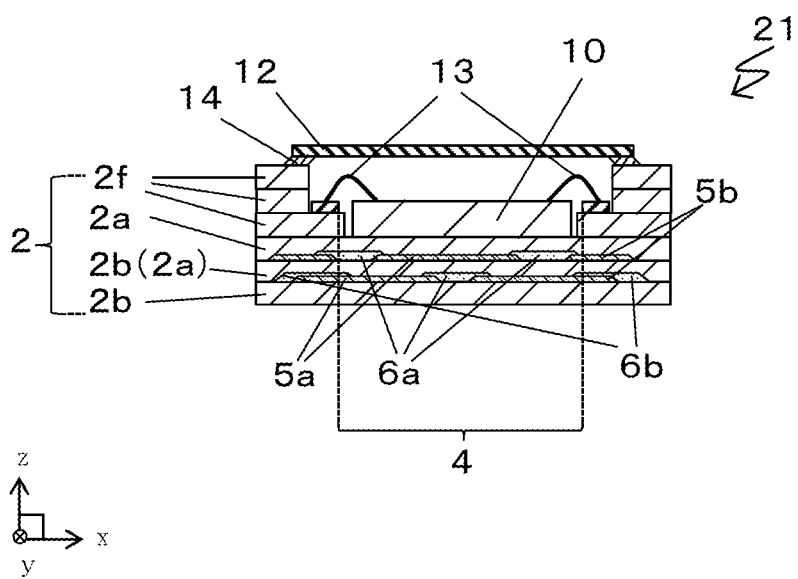
FIG. 14B is a cross-sectional view taken along line X14-X14 in FIG. 14A.

In the example shown in FIGS. 14A and 14B, the electronic component mounting board 1 includes a second insulating film 6b extending from an upper surface of the first wire 5a and/or the second wire 5b to an upper surface of the second insulating layer 2b to an outer end of the second insulating layer 2b. The structure shown in FIGS. 14A and 14B reduces parts of the first wire 5a and/or the second wire 5b uncovered on the side surfaces of the substrate 2 in the electronic component mounting board 1. More specifically, the second insulating film 6b covering the outer terminals of the first wire 5a and and/or the second wire 5b reduce the first wire 5a and/or the second wire 5b from extending by absorbing the lamination liquid used in the process of stacking insulating layers when the amount of lamination liquid exceeds the amount absorbable by the insulating layers. The first wire 5a and/or the second wire 5b in the electronic component mounting board 1 is thus less likely to be uncovered on the side surfaces of the substrate 2. This structure reduces parts of the first metal layer 5 (the first wire 5a and/or the second wire 5b) uncovered on the side surfaces of the substrate 2, and reduces unintended short-circuiting with other components or surface deterioration progressing inward. This reduces malfunctions in the electronic device 21.

The second insulating film 6b may comprise its outer end at a position overlapping the outer edge of the second insulating layer 2b or at a position inward from the outer edge of the second insulating layer 2b as viewed from above. The second insulating film 6b having its outer end overlapping the outer edge of the second insulating layer 2b as viewed from above may reduce delamination between the insulating layers. The second insulating film 6b having its outer end inward from the outer edge of the second insulating layer 2b is reduced from being uncovered on the side surfaces and also causing its thickness to change the profile size of the substrate 2 until the substrate 2 cannot be fit in the housing 32.

In the example shown in FIGS. 14A and 14B, the electronic component mounting board 1 includes the first wires 5a, the second wires 5b, the first insulating films 6a, and the second insulating films 6b in multiple layers. The spaces between the first wires 5a and the second wires 5b deviate from each other as viewed from above. The first insulating layers 6a or the spaces are located without deviating from one another as viewed from above in the example shown in FIGS. 14A and 14B. This structure reduces deformation of the surface of the substrate 2 as described above or reduces voids in the substrate 2. In some embodiments, the spaces may be filled at positions overlapping the mount area for the electronic component 10. This structure comprises the less deformable mount area, and thus improves stable mounting of the electronic component 10 onto the substrate 2.

A method for manufacturing the electronic component mounting board 1 shown in FIGS. 14A and 14B includes, in addition to forming the first insulating film 6a as in the corresponding process described in the first embodiment, covering the upper surface of the first wire paste 45a and/or the upper surface of the second wire paste 45b and the upper surface of the second insulating sheet 42b with a second insulating paste 46b at an outer end of the second insulating sheet 42b. The process allows fabrication of the electronic component mounting board 1 shown in FIGS. 14A and 14B. The resultant electronic component mounting board 1 reduces parts of the first wire 5a and/or the second wire 5b uncovered on the side surfaces of the substrate 2. This structure reduces parts of the first wire 5a and/or the second wire 5b uncovered on the side surfaces of the substrate 2 and reduces unintended short-circuiting with other components or deterioration progressing to the inner wires. This reduces malfunctions in the electronic device 21.

The second insulating paste 46b to be the second insulating film 6b may be applied in the same manner as the first insulating paste 46a to be the first insulating film 6a (e.g., by screen printing) as described in the first embodiment. The second insulating film 6b may be formed from a material similar to the material for the first insulating film 6a. The first insulating film 6a and the second insulating film 6b may contain different materials or the same material. The first insulating film 6a and the second insulating film 6b containing different materials can comprise their physical properties changed appropriately, or for example, the first insulating paste 46a and the second insulating paste 46b can comprise appropriate viscosity or other properties by selecting optimum materials to achieve their intended effects. The first insulating film 6a and the second insulating film 6b containing the same material can be applied using the same plate and can be formed through a single process.

The second insulating paste 46b to be the second insulating film 6b and the first insulating paste 46a to be the first insulating film 6a may be applied in the same process or in different processes. Through the same process, the first insulating paste 46a and the second insulating paste 46b are applied while minimizing their misalignment. Through different processes, the first insulating paste 46a and the second insulating paste 46b can comprise different thicknesses as appropriate for their intended effects. This structure produces the advantages of the embodiments of the present invention.

Sixth Embodiment

Figure 15A:
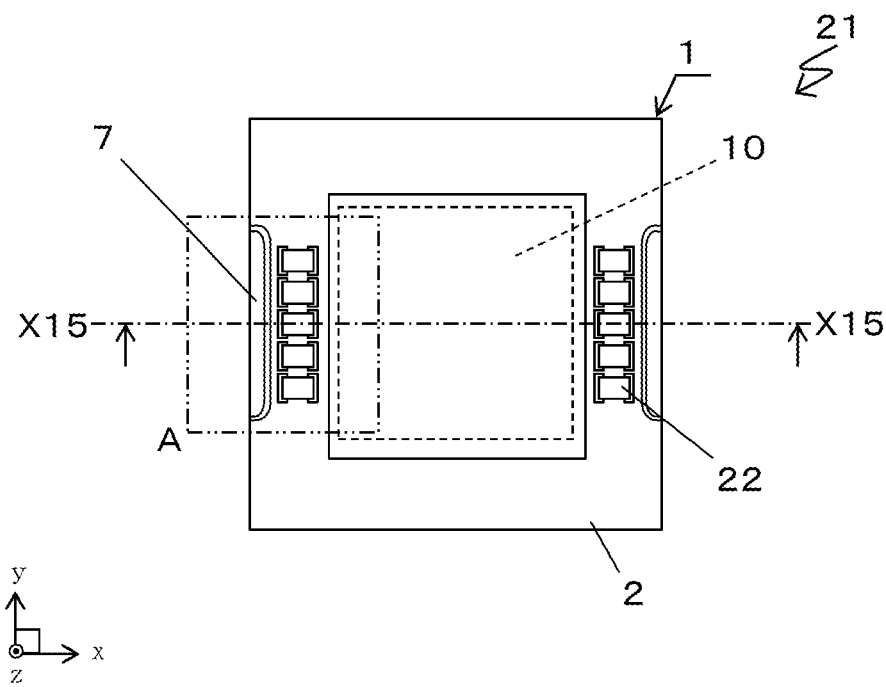
FIG. 15A is an external top view of an electronic component mounting board and an electronic device according to a sixth embodiment of the present invention.
Figure 15B:
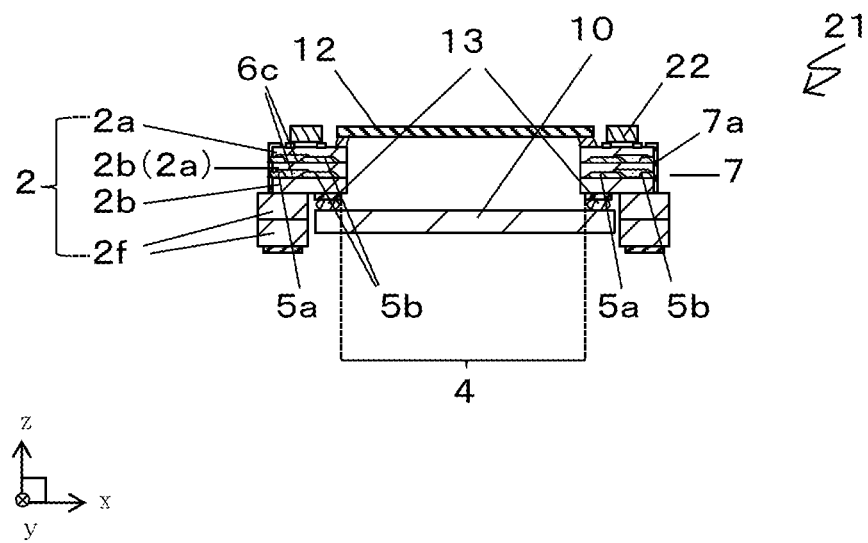
FIG. 15B is a cross-sectional view taken along line X15-X15 in FIG. 15A.
Figure 16:
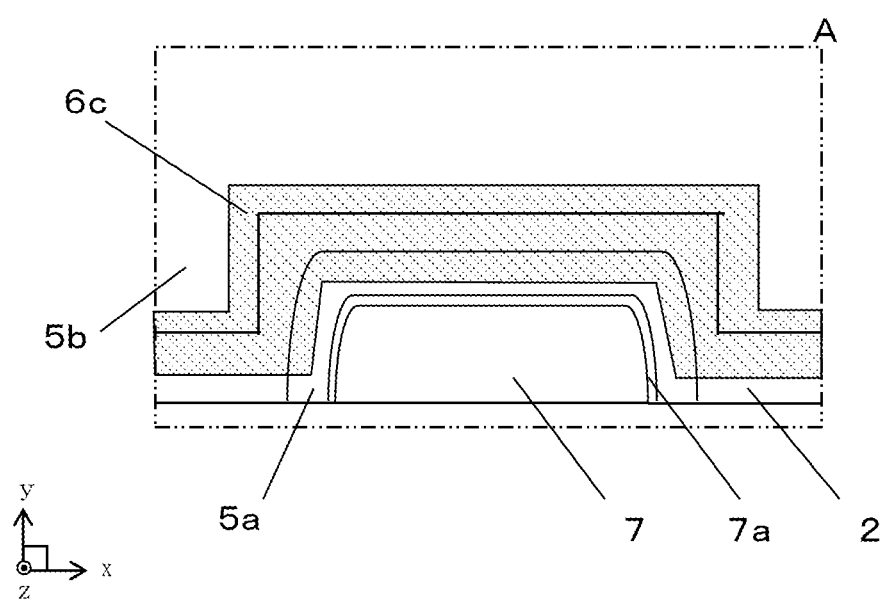
FIG. 16 is an enlarged view of a main part A of the electronic component mounting board according to the embodiment shown in FIGS. 15A and 15B.
Figure 17A:
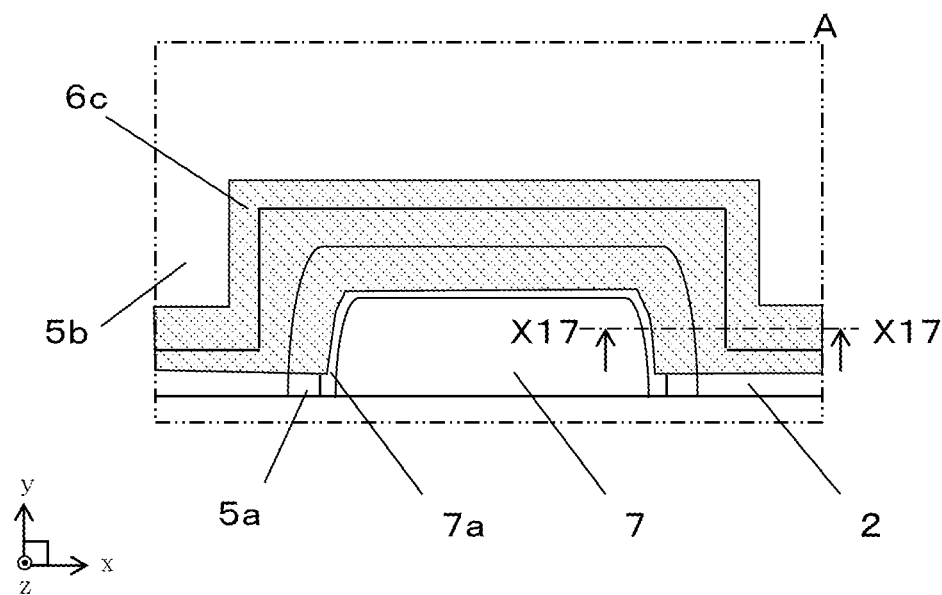
FIG. 17A is an enlarged view of a main part A of the electronic component mounting board according to a modification of the embodiment shown in FIGS. 15A and 15B.
Figure 17B:
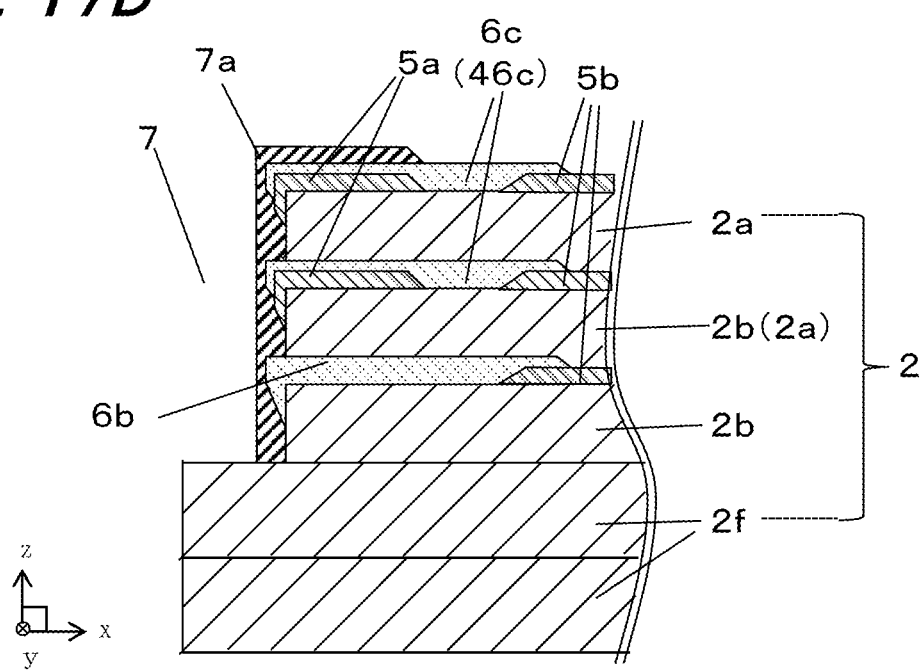
FIG. 17B is a schematic diagram of a cross-sectional view taken along line X17-X17 in FIG. 17A.
Figure 18A:
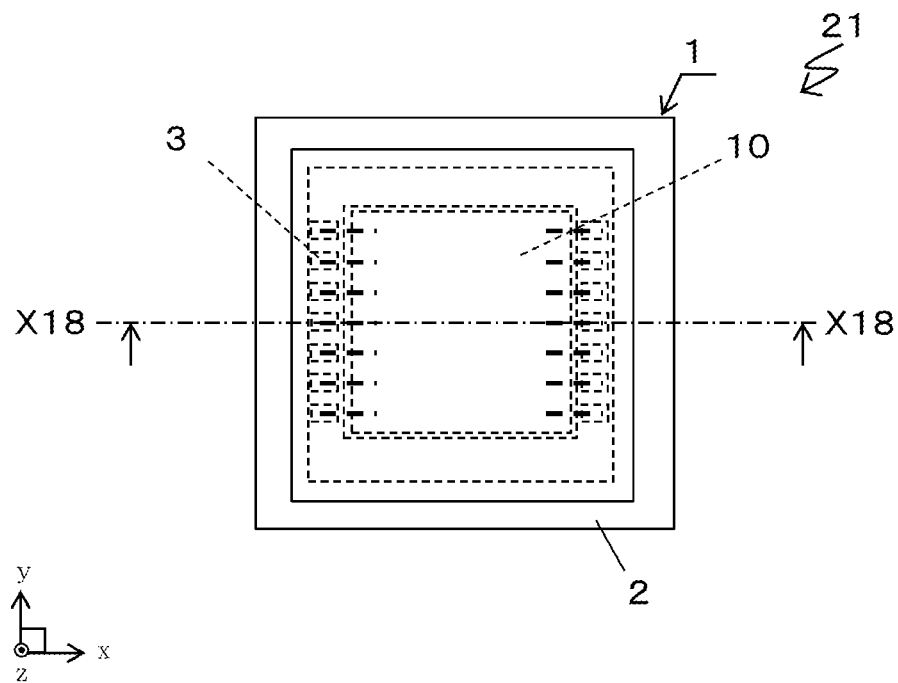
FIG. 18A is an external top view of an electronic component mounting board and an electronic device according to a seventh embodiment of the present invention.
Figure 18B:
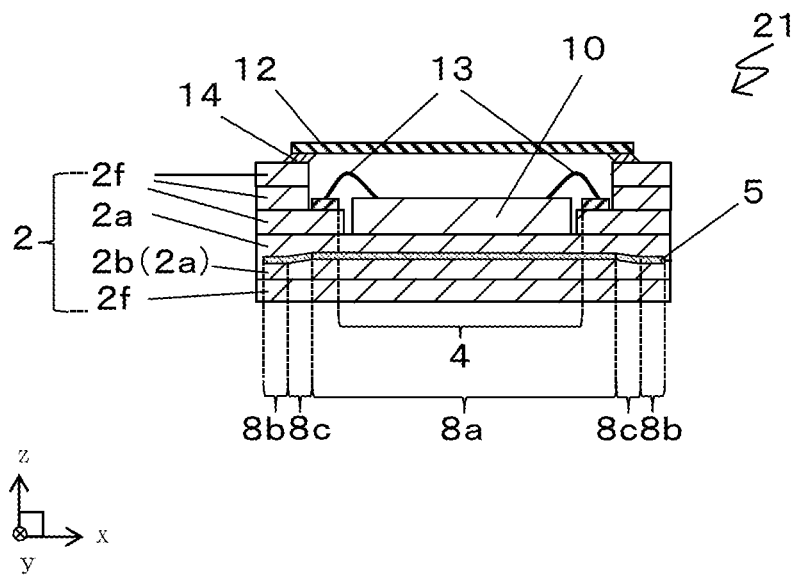
FIG. 18B is a cross-sectional view taken along line X18-X18 in FIG. 18A.

An electronic component mounting board 1 according to a sixth embodiment of the present invention will now be described with reference to FIGS. 15A to 17B. FIGS. 15A and 15B are diagrams showing the structure of the electronic component mounting board 1 and the electronic component 10 according to the present embodiment. FIG. 16 is a schematic enlarged cross-sectional view of a main part A inside the electronic component mounting board 1 shown in FIGS. 15A and 15B. FIGS. 17A and 17B is a schematic enlarged cross-sectional view of a main part A according to a modification of the present embodiment. The main part A is indicated by two-dot chain lines. The electronic component mounting board 1 according to the present embodiment differs from the electronic component mounting board 1 according to the first embodiment in that the substrate 2 comprises a through-hole (the electronic component 10 is mounted in a different manner) and that the substrate 2 comprises a cutout 7 in its side surface and a metalized layer 7a on the side surface.

In the example shown in FIGS. 15A and 15B, the electronic component mounting board 1 comprises a through-hole overlapping the electronic component 10 as viewed from above to receive the electronic component 10 mounted on the electronic device 21. This structure reduces the height of the electronic module 31 when, for example, the electronic component 10 is an imaging device. The electronic component mounting board 1 allows electronic parts 22 to be mounted on its surface. The structure shown in FIGS. 15A and 15B allows more electronic parts 22 to be mountable, and thus can further reduce the size of the electronic device.

The electronic parts 22 may be, for example, passive components including chip capacitors, inductors, and resistors, and active components including optical image stabilizers (OISs), signal processors, and gyro sensors. The electronic parts 22 are connected to the terminals on the substrate 2 with a bond, such as solder or a conductive resin. The electronic parts 22 may be connected to the electronic component 10 with the inner wires in the substrate 2.

The electronic component 10 in FIGS. 15A and 15B may be first bonded to the electronic component mounting board 1 with an electronic component connection 13, such as gold bumps and solder balls, and then may be sealed with a sealant to strengthen the bonding. The electronic component 10 may be bonded with an electronic component connection 13 including an anisotropic conductive film (ACF).

In the example shown in FIGS. 15A and 15B, the electronic component mounting board 1 comprises a cutout 7 from a side wall of the first insulating layer 2a to a side wall of the second insulating layer 2b, and includes a metalized layer 7a located in the surface of cutout 7. The electronic component mounting board 1 having the cutout 7 and including the metalized layer 7a located in the surface of cutout 7 can use the cutout 7 and the metalized layer 7a as side surface terminals. This allows the electronic module 31 including the electronic component mounting board 1 to comprise electrical connection between the housing 32 and the electronic component mounting board 1.

The electronic component mounting board 1 may receive legs or other parts of the housing 32 in the cutout 7. The metalized layer 7a located in the cutout 7 allows the housing 32 to be fixed to the electronic component mounting board 1 with a metal material, such as solder. This further improves the bond strength. The cutout 7 and/or the metalized layer 7a may also be included in the additional insulating layer 2f. The cutout 7 in each of the first insulating layer 2a, the second insulating layer 2b and/or the additional insulating layer 2f may comprise a different size.

The metalized layer 7a may be formed from a material similar to the material for the first wire 5a or the second wire 5b. The metalized layer 7a may contain the same as or a different material from the material of the first wire 5a and/or the second wire 5b. The metalized layer 7a containing the same material can comprise its physical properties and characteristics equal to those of the first wire 5a and/or the second wire 5b. This allows common specifications to be used during manufacture. The metalized layer 7a containing a different material from the material of the first wire 5a and/or the second wire 5b can comprise its physical properties and characteristics different from those of the first wire 5a and/or the second wire 5b. This allows selection of appropriate materials with specifications for easy manufacture. In particular, the metalized layer 7a, which is to be applied to the side surfaces, can be formed from a selected material with, for example, high viscosity when the metalized layer 7a and the first wire 5a and/or the second wire 5b are formed from different materials.

As in the example shown in FIGS. 15A and 15B, the first wire 5a and/or the second wire 5b in the electronic component mounting board 1 comprises an end near the outer edge of the second insulating layer 2b that extends to the cutout 7. The upper surface of the end of the first wire 5a and/or the second wire 5b extending to the cutout 7 is covered with a third insulating film 6c. This structure reduces parts of the first wire 5a and/or the second wire 5b uncovered on the side surface of the cutout 7 in the electronic component mounting board 1. More specifically, the third insulating film 6c covering the outer terminals of the first wire 5a and/or the second wire 5b reduces the first wire 5a and/or the second wire 5b from extending by absorbing the lamination liquid in the stacking process when the amount of lamination liquid exceeds the amount absorbable by the insulating layers.

The first wire 5a and/or the second wire 5b in the electronic component mounting board 1 is thus less likely to be uncovered on the side surface of the cutout 7. This structure reduces parts of the first wire 5a and/or the second wire 5b uncovered on the side surface of the cutout 7, and thus reduces unintended short-circuiting between the housing 32 or changes in the diameter of the cutout 7 caused by the first and second wires 5a or 5b until the legs of the housing 32 cannot be fit in the housing 32.

The end of the first wire 5a and/or the second wire 5b may be electrically connected to the metalized film 7a. In this structure, the third insulating film 6c may be between the first wire 5a or the second wire 5b electrically connected to the metalized film 7a and another second wire 5b or another first wire 5a. This reduces unintended short-circuiting between the first wire 5a or the second wire 5b electrically connected to the metalized layer 7a and another second wire 5b or another first wire 5a at other positions.

In other words, the third insulating film 6c fills the space between the first wire 5a or the second wire 5b electrically connected to the metalized layer 7a and another second wire 5b or another first wire 5a. This reduces the first wire 5a and/or the second wire 5b from extending by absorbing the lamination liquid in the process of stacking insulating layers when the amount of lamination liquid used in the process exceeds the amount absorbable by the insulating layers.

This reduces unintended short-circuiting between the first wire 5a or the second wire 5b electrically connected to the metalized layer 7a and another second wire 5b or another first wire 5a in the electronic component mounting board 1. In the same manner as above, this further reduces unintended short-circuiting between the housing 32 and the first wire 5a and/or the second wire 5b uncovered on the side surface of the cutout 7 or changes in the diameter of the cutout 7 caused by the first and second wires 5a or 5b until the legs of the housing 32 cannot be fit in the housing 32.

FIGS. 16 to 17B are schematic enlarged cross-sectional views of the main part A of the electronic component mounting board 1 according to the sixth embodiment. In the present embodiment, the third insulating film 6c may comprise an outer edge located inward from the outer edge of the cutout 7 as viewed from above as in the example shown in FIG. 16, or the outer edges may overlap each other as in the example shown in FIGS. 17A and 17B. The third insulating film 6c having its outer edge inward from the outer edge of the cutout 7 as viewed from above as in the example shown in FIG. 16 reduces changes in the diameter of the cutout 7 caused by the thickness of the third insulating film 6c until the legs of the housing 32 are unfit in the housing 32. The third insulating film 6c having its outer edge overlapping the outer edge of the cutout 7 as in the example shown in FIGS. 17A and 17B increases the area in which the first wire 5a or the second wire 5b electrically connected to the metalized layer 7a overlaps the third insulating film 6c, and thus reduces short-circuiting with another second wire 5b or another first wire 5a.

As in the example shown in FIG. 17B, the third insulating film 6c having its outer edge overlapping the outer edge of the cutout 7 as viewed from above may cover the side surface of the cutout 7, which may further be covered with the metalized layer 7a. This structure allows the first wire 5a or the second wire 5b electrically connected to the metalized layer 7a to be pressed by the third insulating film 6c and the metalized layer 7a, and improves the bond strength between the substrate 2 and the first wire 5a or the second wire 5b electrically connected to the metalized layer 7a. This improves the reliability of the electronic component mounting board 1.

As in the example in FIG. 17B, the structure may include the first wires 5a and the second wires 5b between multiple insulating layers. The first wires 5a and the second wires 5b may include layers between them, which are not electrically connected to the metalized layer 7a. In this structure, the substrate may include the second insulating film 6b extending from the end of the first wire 5a or the second wire 5b nearer the cutout 7 to the cutout 7. The second insulating film 6b may or may not cover the side wall of the cutout 7. This structure also reduces parts of the first wire 5a or the second wire 5b uncovered on the side surface of the cutout 7 in the electronic component mounting board 1, thus reducing unintended short-circuiting between the housing 32 and the first wire 5a or the second wire 5b uncovered on the side surface of the cutout 7 or changes in the diameter of the cutout 7 caused by the first wire 5a or the second wire 5b until the legs of the housing 32 cannot be fit in the housing 32.

The electronic component mounting board 1 shown in FIGS. 15A to 16 is manufactured with a method including, in addition to the processes described in the first embodiment, applying the first wire paste 45a or the second wire paste 45b onto a side wall of the second insulating sheet 42b, and covering the second insulating sheet 42b with a third insulating paste 46c from the upper surface of the first wire paste 45a or the second wire paste 45b extending toward the cutout 7 to the upper surface of another first wire 5a or another second wire 5b. The method may further include covering the side surface of the cutout 7 with the metalized film 7a. The above processes allow fabrication of the electronic component mounting board 1 with the structure shown in FIGS. 15A to 16. This structure reduces short-circuiting between the first wire 5a (first wire paste 45a) or the second wire 5b (second wire paste 45b) extending to the cutout 7 and another second wire 5b or another first wire 5a in the electronic component mounting board 1.

The side surface of the cutout 7 may be covered with the metalized film 7a by, for example, screen printing using a plate prepared with the printing inward from the side surface of the cutout 7 for applying a metal paste to be the metalized film 7a onto the upper surface of the cutout 7.

The electronic component mounting board 1 shown in FIGS. 17A and 17B is manufactured with a method including, in addition to the processes described in the first embodiment, applying the first wire paste 45a or the second wire paste 45b onto the side surface of the second insulating sheet 42b, and covering the first wire paste 45a or the second wire paste 45b applied to the side wall of the second insulating sheet 42b with the third insulating paste 46c. The method may further include, in the same manner as the manufacturing method for the structure shown in FIGS. 15A to 16, covering the side surface of the cutout 7, the first wire paste 45a or the second wire paste 45b, and the third insulating paste 46c with the metalized film 7a.

The above processes allow fabrication of the electronic component mounting board 1 with the structure shown in FIGS. 17A and 17B. This structure provides the advantages of the embodiments of the present invention and allows the first wire 5a or the second wire 5b electrically connected to the metalized layer 7a to be pressed by the third insulating film 6c and the metalized layer 7a. This improves the bond strength between the substrate 2 and the first wire 5a or the second wire 5b electrically connected to the metalized layer 7a, and thus improves the reliability of the electronic component mounting board 1.

Seventh Embodiment

An electronic module 31, an electronic device 21, and an electronic component mounting board 1 according to a seventh embodiment of the present invention will now be described with reference to FIGS. 18A to 20.

The electronic component mounting board 1 includes a first metal layer 5 that includes a first portion 8a located parallel to the mount area 4, a second portion 8b located at an end of the first metal layer 5 and above or below the first portion 8a, and a first slope 8c extending between the first portion 8a and the second portion 8b in the cross-sectional view. In the electronic component mounting board 1 according to the present embodiment, the first slope 8c having a z-direction component of the substrate 2 and the second portion 8b located below or above the first portion 8a particularly function as a shield. The shield effectively reduces electromagnetic noise generated near the first metal layer 5 in the substrate 2, and thus reduces electromagnetic noise leaking from the electronic component mounting board 1. This reduces malfunctions in nearby electronic devices or electronic parts caused by electromagnetic noise leaking from the electronic component mounting board 1. The electronic component mounting board 1 that comprises recently been thinner includes thinner insulating layers. The first metal layer 5 with the slope can increase its dimension in z-direction, and enables more effective shielding.

When receiving external electromagnetic noise generated outside the electronic component mounting board 1 and propagating to the substrate 2, the substrate 2 including the first slope 8c having the z-axis component and the second portion 8b located below or above the first portion 8a effectively reduce such propagating external electromagnetic noise. This structure reduces electromagnetic noise affecting the area of the substrate 2 defined by the first metal layer 5.

The first portion 8a in the first metal layer 5 located parallel to the mount area 4 may be located at any other positions between the first insulating layer 2a and the second insulating layer 2b. For example, the first portion 8a may extend across substantially the entire substrate 2 or partially along the substrate 2 in the cross-sectional view as in the examples shown in FIGS. 18A to 19B. The first portion 8a may comprise any size. For example, the first portion 8a may comprise a length of at least about 150 μm in x-direction in the cross-sectional view.

The second portion 8b in the first metal layer 5, which is located on each of the two ends of the first metal layer 5, may also be at other positions. In other words, the first metal layer 5 may comprise another second portion 8b around the center of the first metal layer 5 in the cross-sectional view. The second portion 8b may comprise a length of at least 30 μm in x-direction in the cross-sectional view.

The first slope 8c in the first metal layer 5 comprises a length in z-direction of about 10 to 40% of the thickness of the first insulating layer 2a or the second insulating layer 2b. More specifically, when the first insulating layer 2a or the second insulating layer 2b comprises a thickness of 35 the first slope 8c comprises a length in z-direction of about 3.5 to 14 The first slope 8c with the specified length comprises a sufficiently large component in z-direction, and enables more effective shielding. The first slope 8c with a greater length in z-direction enables more effective shielding.

The first metal layer 5 may be at a position overlapping the wires that can readily serve as antennas for electromagnetic noise, such as MIPI wires and signal wires, or wires that are susceptive to noise components as viewed from above. The first metal layer 5 overlapping those wires as viewed from above enables more effective shielding. This structure enables more effective shielding of the wires that can readily serve as antennas for electromagnetic noise or the wires susceptive to noise components.

The second portion 8b and the first slope 8c in the first metal layer 5 may be located only in a part of the outer edge of the first portion 8a, or may be located along the entire perimeter of the first portion 8a. The second portion 8b and the first slope 8c in the first metal layer 5 located along the entire perimeter of the first portion 8a further improve shielding against electromagnetic noise generated by electromagnetic induction.

Figure 19A:
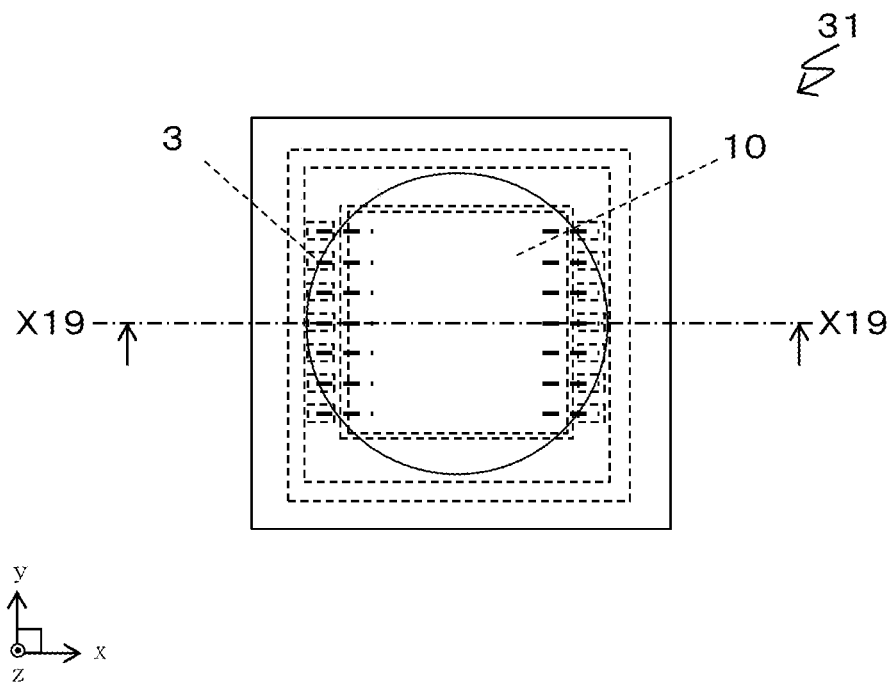
FIG. 19A is an external top view of an electronic component mounting board, an electronic device, and an electronic module according to a modification of the seventh embodiment of the present invention.
Figure 19B:
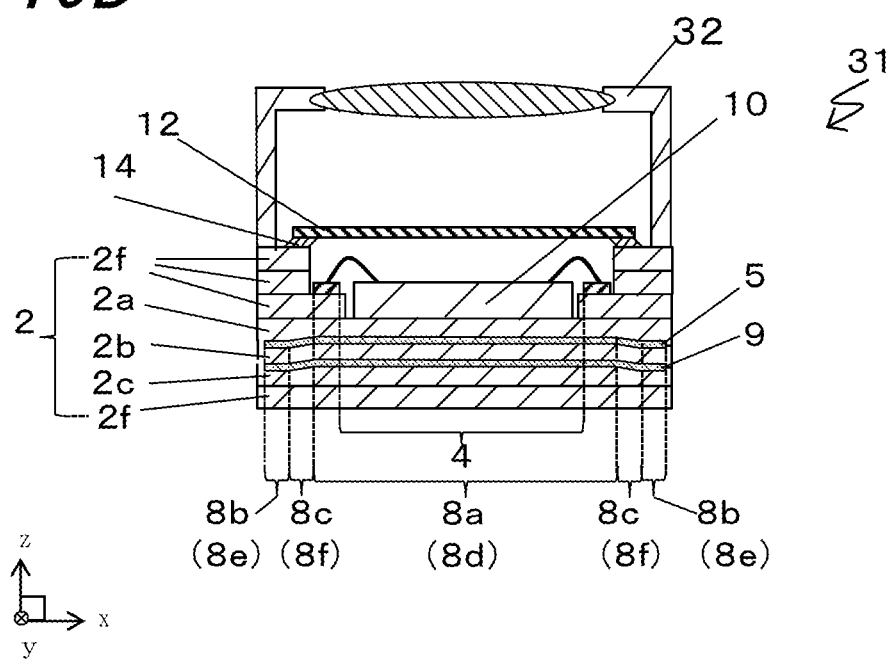
FIG. 19B is a cross-sectional view taken along line X19-X19 in FIG. 19A.

FIGS. 19A and 19B show a modification of the present embodiment. The structure shown in FIGS. 19A and 19B includes a second metal layer 9 on the lower surface of the second insulating layer 2b, and a third insulating layer 2c on the lower surface of the second metal layer 9. In the cross-sectional view, the second metal layer 9 includes a first portion 8a (third portion 8d) located parallel to the mount area 4, a second portion 8b (fourth portion 8e) located below the first portion 8a (third portion 8d), and a first slope 8c (second slope 8f) extending between the first portion 8a (third portion 8d) and the second portion 8b (fourth portion 8e). The first metal layer 5 and the second metal layer 9 overlap each other as viewed from above to upsize the shielding wall in a pseudo manner. This reduces electromagnetic noise leakage outside as well as propagating external electromagnetic noise. This structure is thus less susceptive to electromagnetic noise.

In the example shown in FIGS. 19A and 19B, the second portion 8b in the first metal layer 5 and the second portion 8b (fourth portion 8e) in the second metal layer 9 overlap each other. This structure maintains an insulating gap between the second portion 8*b* in the first metal layer 5 and the second portion 8*b* (fourth portion 8*e*) in the second metal layer 9. This structure reduces electromagnetic noise that can be generated when the second portion 8*b* in the first metal layer 5 and the second portion 8*b* (fourth portion 8*e*) in the second metal layer 9 interfere with each other. Although the first metal layer 5 and the second metal layer 9 overlap completely in the example shown in FIGS. 19A and 19B, the layers may be located at different positions in the cross-sectional view.

Figure 20:
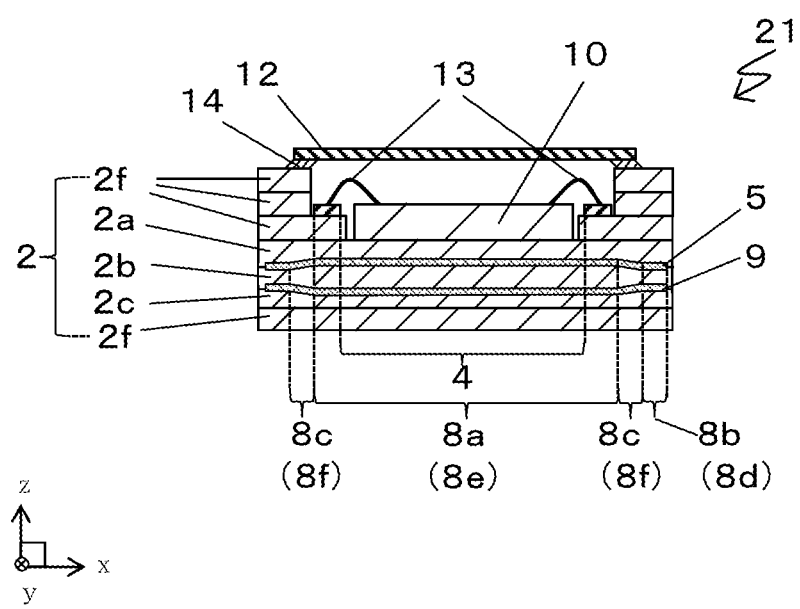
FIG. 20 is a cross-sectional view of an electronic component mounting board and an electronic device according to another modification of the seventh embodiment of the present invention.

In the example shown in FIG. 20, the first portion 8*a* in first metal layer 5 and the second portion 8*b* (fourth portion 8*e*) in the second metal layer 9 overlap each other as viewed from above. This structure allows adjustment of the distance between the first portion 8*a* in the first metal layer 5 and the second portion 8*b* (fourth portion 8*e*) in the second metal layer 9. This structure thus allows adjustment of the impedance for the first portion 8*a* in the first metal layer 5 and the second portion 8*b* (fourth portion 8*e*) in the second metal layer 9 having different wires, while providing the advantages according to one or more embodiments of the present invention.

In the example shown in FIG. 20, the second portion 8*b* in the first metal layer 5 and the first portion 8*a* (third portion 8*d*) in the second metal layer 9 overlap each other as viewed from above. This structure shortens the distance between the second portion 8*b* in the first metal layer 5 and the first portion 8*a* (third portion 8*d*) in the second metal layer 9 in the cross-sectional view. The shorter distance further narrows the entrance or the exit for electromagnetic noise and enables more effective shielding to reduce electromagnetic noise affecting the area defined by the first portion 8*a* and the fourth portion 8*e*. This reduces propagating external electromagnetic noise affecting the area defined by the first metal layer 5 and the second metal layer 9 included in the substrate 2, reduces electromagnetic noise leakage outside.

Although the first metal layer 5 and the second metal layer 9 overlap completely in the example shown in FIGS. 19A to 20, the layers may be located at different positions in the cross-sectional view.

When the substrate 2 comprised an electrical insulating ceramic material, the second metal layer 9 comprised tungsten (W), molybdenum (Mo), manganese (Mn), silver (Ag), or copper (Cu), or an alloy containing one or more of these metals. The first metal layer 5 and the second metal layer 9 may be formed from the same material or different materials.

The second metal layer 9 may be a ground potential, or may not be electrically connected to any signal line or may be another potential. The second metal layer 9 electrically connected to a ground potential enables more effective shielding. This structure is thus less susceptive to electromagnetic noise.

When the first metal layer 5 and the second metal layer 9 comprise the same potential, the layers may be electrically connected through feedthrough conductors. In this structure, the feedthrough conductors electrically connected to wires that can readily serve as antennas for electromagnetic noise, such as MIPI wires and signal wires, or to wires that are susceptive to noise components may be defined by the first metal layer 5, the second metal layer 9, and the feedthrough conductors that electrically connect the two metal layers. This enables still more effective shielding. This structure reduces electromagnetic noise affecting the feedthrough conductors electrically connected to wires that can readily serve as antennas for electromagnetic noise or wires that are susceptive to noise components. The feedthrough conductors that electrically connect the first metal layer 5 and the second metal layer 9 may surround the feedthrough conductors to be shielded continuously as appropriate. This enables still more effective shielding.

The first portion 8*a* (third portion 8*d*) in the second metal layer 9 located parallel to the mount area 4 may be at any positions between the second insulating layer 2*b* and the third insulating layer 2*c*. For example, the first portion 8*a* (third portion 8*d*) may extend across substantially the entire substrate 2 or partially along the substrate 2 in the cross-sectional view as in the examples shown in FIGS. 19A to 20. The first portion 8*a* (third portion 8*d*) may comprise any size. For example, the first portion may comprise a length of at least about 150 μm in x-direction in the cross-sectional view.

The second portion 8*b* (fourth portion 8*e*) in the second metal layer 9, which is located on each of the two ends of the second metal layer 9, may also be at other positions. In other words, the second metal layer 9 may comprise another second portion 8*b* (fourth portion 8*e*) around the center of the second metal layer 9 in the cross-sectional view. The second portion 8*b* (fourth portion 8*e*) may comprise a length of at least 30 μm in x-direction in the cross-sectional view.

The second slope 8*f* in the second metal layer 9 comprises a length in z-direction of about 10 to 40% of the thickness of the second insulating layer 2*b* or the third insulating layer 2*c*. More specifically, when the second insulating layer 2*b* or the third insulating layer 2*c* comprises a thickness of 35 μm the second slope 8*f* comprises a length in z-direction of about 3.5 to 14 μm. The second slope 8*f* with this specified length in z-direction enables more effective shielding. The second slope 8*f* with a greater length in z-direction enables more effective shielding.

Method for Manufacturing Electronic Component Mounting Board and Electronic Device An example method for manufacturing the electronic component mounting board 1 and the electronic device 21 according to the present embodiment will now be described. The method for manufacturing the electronic component mounting board 1 and the electronic device 21 according to the present embodiment is basically similar to the method described in the first embodiment. The processes associated with the second portion 8*b* (fourth portion 8*e*) will now be described.

To form the second portion 8*b* (fourth portion 8*e*) and the first slope 8*c* (second slope 8*f*), for example, a first ceramic green sheet 42*a* or a second ceramic green sheet 42*b* may be pressed with, for example, a mold, to form a recess, into which a metal paste 45 is printed or applied to form the second portion 8*b* and the first slope 8*c*. In some embodiments, the first ceramic green sheet 42*a* or the second ceramic green sheet 42*b* may be coated with the metal paste 45, and then pressed with, for example, a mold to form the second portion 8*b* (fourth portion 8*e*) and the first slope 8*c* (second slope 8*f*).

Eighth Embodiment

An electronic component mounting board 1 according to an eighth embodiment of the present invention will now be described with reference to FIGS. 21A to 21B. The electronic component mounting board 1 according to the present embodiment differs from the electronic component mounting board 1 according to each of the first embodiment and the seventh embodiment in that the substrate 2 comprises an opening that extends from the upper surface to the lower surface.

Figure 21A:
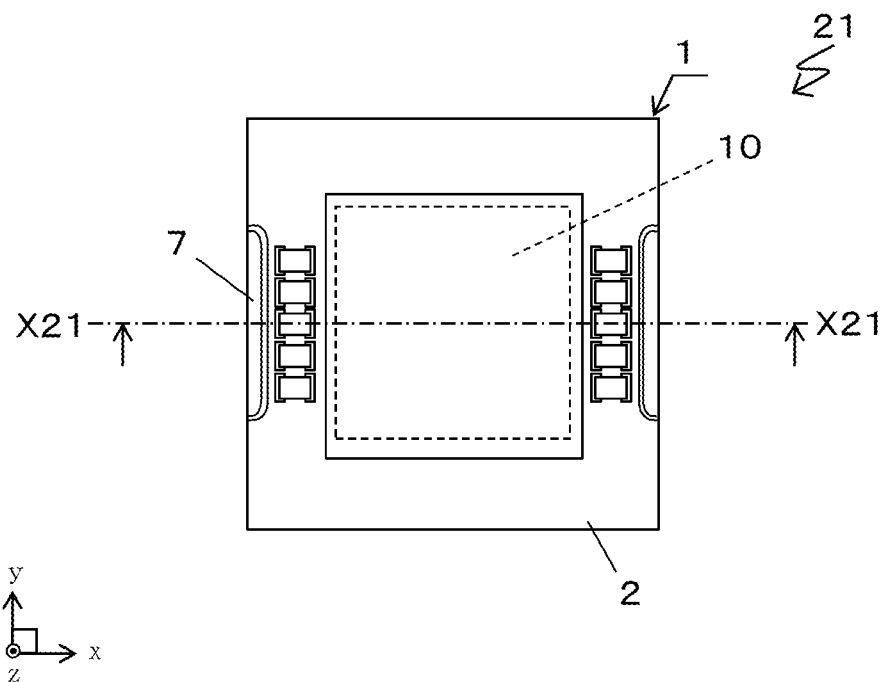
FIG. 21A is an external top view of an electronic component mounting board and an electronic device according to an eighth embodiment of the present invention.
Figure 21B:
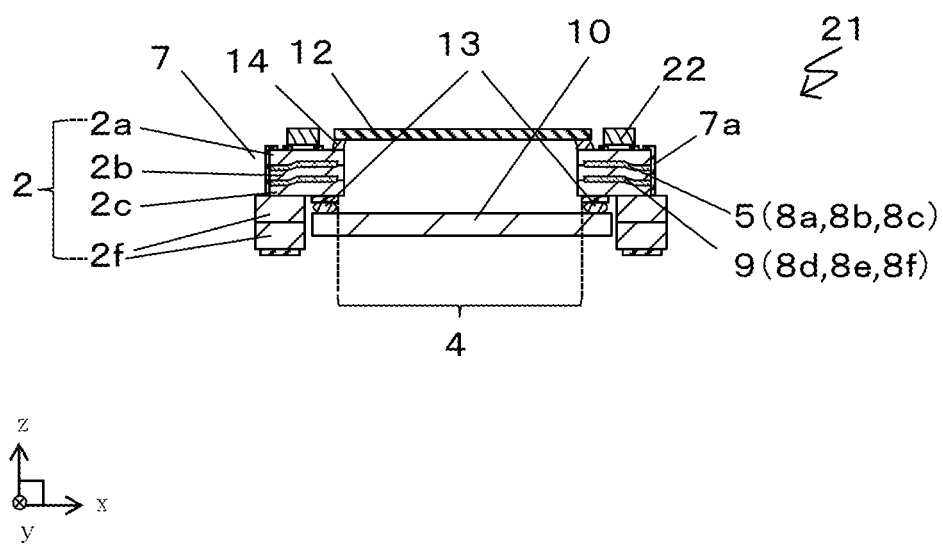
FIG. 21B is a cross-sectional view taken along line X21-X21 in FIG. 21A.

In the example shown in FIGS. 21A and 21B, a through-hole is formed through the first insulating layer 2*a*, the second insulating layer 2b, the third insulating layer 2c, and the additional insulating layer 2f included in the electronic component mounting board 1. The through-hole extends from the upper surface to the lower surface at a position overlapping the mounting area as viewed from above. The electronic component mounting board 1 with this structure may be used for the electronic component 10 including a CMOS, or a CCD. The electronic component 10 is mounted on electrodes 3 arranged on the lower surface of the substrate 2 using electronic component connections 13, such as gold bumps, and overlaps the through-hole as viewed from above. The substrate 2 with this structure includes a first metal layer 5 between the first insulating layer 2a and the second insulating layer 2b. The first metal layer 5 may comprise a second portion 8b at least at the outer edge of the substrate 2. In other words, the first metal layer 5, which defines the through-hole, comprises the second portion 8b on each of the two ends (or at each outer edge), and may or may not comprise the second portion 8b at each inner end that defines the through-hole. This structure allows the second portion 8b and the first slope 8c to function as a shield. The shield effectively reduces electromagnetic noise generated near the metal layer 5 in the substrate 2 and thus reduces electromagnetic noise leaking from the electronic component mounting board 1. When receiving external electromagnetic noise generated outside the electronic component mounting board 1 and propagating to the substrate 2, the shield effectively reduces such propagating external electromagnetic noise. This structure reduces electromagnetic noise affecting the area of the substrate 2 defined by the first metal layer 5, and reduces electromagnetic noise leakage outside.

When the substrate 2 comprises the through-hole, the first metal layer 5 may define a half or more of the circumference of the through-hole in the substrate 2. This allows the second portion 8b and the first slope 8c to define a half or more of the circumference of the substrate 2. This structure is thus less susceptible to electromagnetic noise.

The first metal layer 5 may comprise the second portion 8b at its inner end that defines the through-hole. This structure reduces external electromagnetic noise from propagating through the through-hole, and also reduces electromagnetic noise leaking and propagating to the electronic component 10.

The first metal layer 5 may be located on a layer immediately above or immediately below the electrodes 3. The first metal layer 5 located on a layer immediately above or immediately below the electrodes 3 allows the electrodes 3 and the electronic component connections 13 to function as a shield. This reduces propagating electromagnetic noise affecting the electrodes 3 and the electronic component connections 13.

In the example shown in FIGS. 21A and 21B, the substrate 2 comprises a cutout 7 and a metalized layer 7a located from the upper surface of the cutout 7 to the side surface and to the lower surface at the outer edge. In this structure, the second portion 8b in the first metal layer 5 may be electrically connected to the metalized layer 7a. This allows the metalized layer 7a to also function as a shield to reduce electromagnetic noise leakage outside as well as propagating external electromagnetic noise.

As in the example shown in FIGS. 21A and 21B, the electronic component mounting board 1 may include a second metal layer 9 under the first metal layer 5. This structure further improves shielding against electromagnetic noise.

The above electronic component mounting board 1 is manufactured basically in the same manner as the electronic component mounting board 1 according to each of the first embodiment and the seventh embodiment. The electronic component mounting board 1 according to the present embodiment may be manufactured by forming the through-hole through the substrate 2 using a laser beam or a mold in the processes for manufacturing the electronic component mounting board 1 according to the first or seventh embodiment. The through-hole through the substrate 2 may be formed before or after the first metal layer 5 is formed.

Ninth Embodiment

An electronic component mounting board 1 according to a ninth embodiment of the present invention will now be described with reference to FIGS. 22A to 22B. The electronic component mounting board 1 according to the present embodiment differs from the electronic component mounting board 1 according to each of the first embodiment and the seventh embodiment in that the first metal layer 5 includes a plurality of second portions 8b.

Figure 22A:
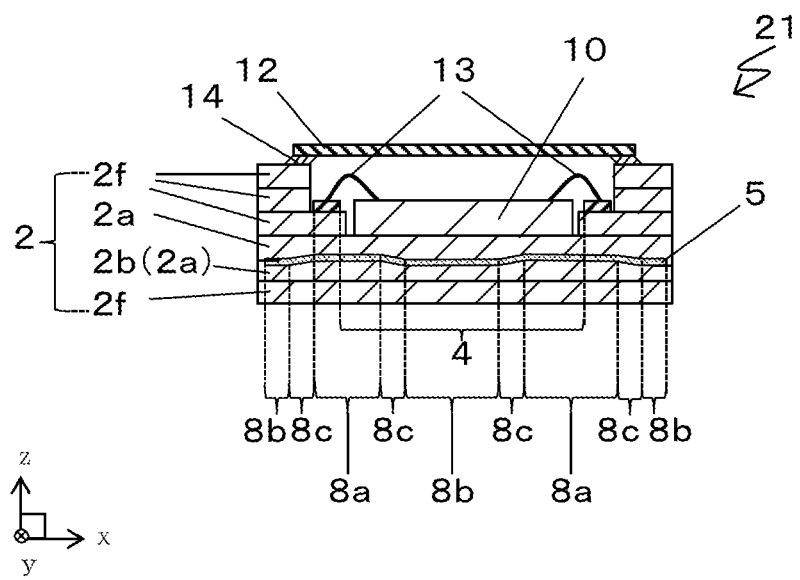
FIG. 22A is a cross-sectional view of an electronic component mounting board and an electronic device according to a ninth embodiment of the present invention.

In the example shown in FIG. 22A, the first metal layer 5 includes a second portion 8b and a first slope 8c on each of the two ends, and another second portion 8b and another first slope 8c at a position overlapping the mount area on the substrate 2. This structure allows the second portion 8b and the first slope 8c located at the position overlapping the mount area 4 of the substrate 2 and another second portion 8b located on each of the two ends of the first metal layer 5 to function as a shielding wall. The shielding wall attenuates electromagnetic noise passing through the second portion 8b located at the position overlapping the mount area 4 on the substrate 2. This further reduces the total amount of electromagnetic noise leaking from the electronic component mounting board 1. The structure may include a first insulating film 6a or a second insulating film 6b on the upper surface of each second portion 8b.

Figure 22B:
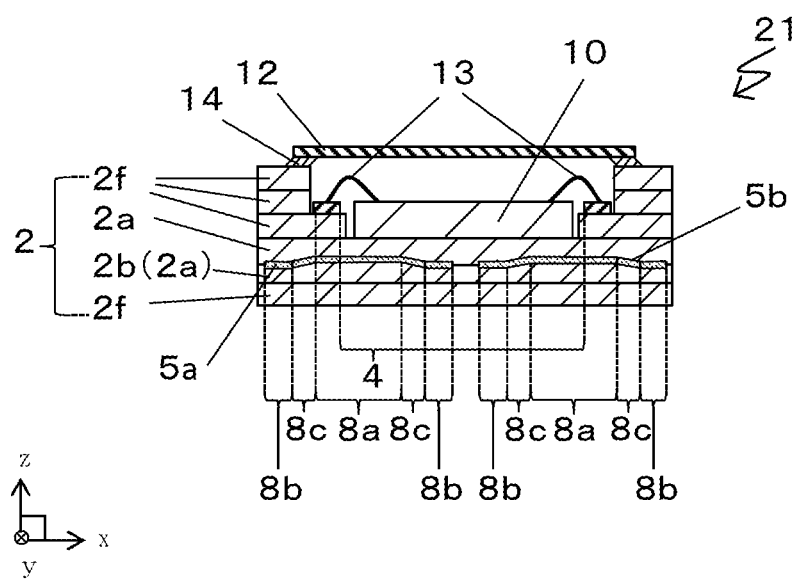
FIG. 22B is a cross-sectional view of an electronic component mounting board and an electronic device according to a modification of the ninth embodiment.

The structure shown in FIG. 22B includes the second portions 8b and the first slope 8c between the first wire 5a and the second wire 5b, and also at the opposite end of each wire, or specifically near the perimeter of the substrate 2. This structure is less susceptible to electromagnetic noise from the multiple metalized portions (the first wire 5a and the second wire 5b), and reduces electromagnetic noise leaking from the electronic component mounting board 1. The structure also effectively reduces external electromagnetic noise generated outside the electronic component mounting board and propagating to the substrate 2. When receiving external electromagnetic noise generated outside the electronic component mounting board 1 and propagating to the substrate 2, the shield effectively reduces such propagating external electromagnetic noise. This structure reduces electromagnetic noise from adjacent metalized portions located in the area defined by the first metal layer 5 among the multiple metalized portions (the first wire 5a and the second wire 5b) in the substrate 2, reduces external electromagnetic noise propagating to the electronic component mounting board 1, and reduces electromagnetic noise leakage outside. The structure may include the first insulating film 6a or the second insulating film 6b extending from the upper surface of the second portion 8b to the upper surface of the second insulating layer 2b.

The above electronic component mounting board 1 is manufactured basically in the same manner as the electronic component mounting board 1 according to each of the first embodiment and the seventh embodiment. The electronic component mounting board 1 according to the present embodiment may be manufactured by increasing the number of portions receiving the ceramic paste 42f to be the second portion 8b in a predetermined manner in the processes for manufacturing the electronic component mounting board 1 according to the first or seventh embodiment.

Tenth Embodiment

An electronic component mounting board 1 according to a tenth embodiment of the present invention will now be described with reference to FIGS. 23A to 23B. The electronic component mounting board 1 according to the present embodiment differs from the electronic component mounting board 1 according to each of the first embodiment and the seventh embodiment in that this structure includes an additional insulating layer 2f between the second insulating layer 2b and the third insulating layer 2c, and an additional metal layer 15 located on the upper surface of the additional insulating layer 2f and between first metal layer 5 and the second metal layer 9.

Figure 23A:
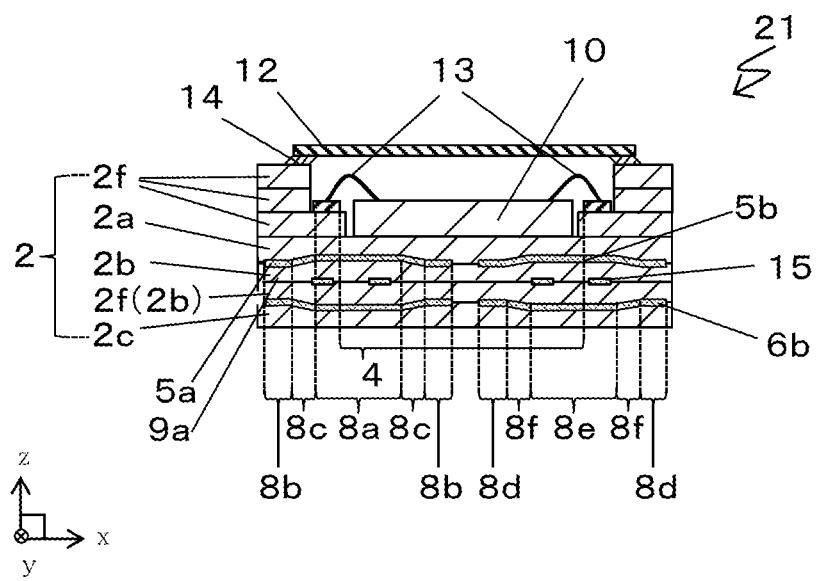
FIG. 23A is a cross-sectional view of an electronic component mounting board and an electronic device according to a tenth embodiment of the present invention.
Figure 23B:
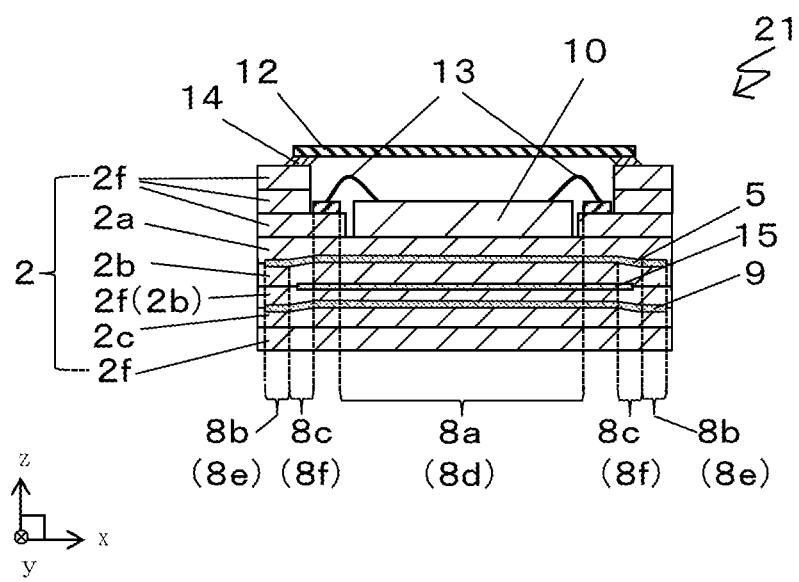
FIG. 23B is a cross-sectional view of an electronic component mounting board and an electronic device according to a modification of the tenth embodiment.

In the example shown in FIGS. 23A and 23B, the electronic component mounting board 1 includes the additional insulating layer 2f between the second insulating layer 2b and the third insulating layer 2c, and the additional metal layer 15 located on the upper surface of the additional insulating layer 2f and between the first metal layer 5 and the second metal layer 9 in the cross-sectional view. This structure allows the first metal layer 5 and the second metal layer 9 to surround the additional metal layer 15 to further reduce electromagnetic noise affecting the additional metal layer 15.

In the example shown in FIG. 23A, the first metal layer 5 and the second metal layer 9 each include a plurality of metalized portions (the first wire 5a and the second wire 5b, and the third wire 9a and the fourth wire 9b). The second portion 8b in the first metal layer 5 and the first portion 8a (third portion 8d) in the second metal layer 9 overlap each other as viewed from above. The substrate 2 further includes a plurality of additional metal layers 15 between the first portion 8a in the first metal layer 5 and the second portion 8b (fourth portion 8e) in the second metal layer 9. This structure shortens the distance between the second portion 8b in the first metal layer 5 and the first portion 8a (third portion 8d) in the second metal layer 9 in the cross-sectional view. The shorter distance further narrows the entrance or the exit for electromagnetic noise and enables more effective shielding to reduce electromagnetic noise affecting the additional metal layer 15 located in the area defined by the first portion 8a and the second portion 8b (fourth portion 8e). When the additional metal layer 15 includes a signal wire or a pair wire, the additional metal layer 15 is susceptible to electromagnetic noise. The additional metal layer 15 defined by the first metal layer 5 and the second metal layer 9 as in the structure shown in FIG. 23A is less susceptible to electromagnetic noise, and thus allows easier impedance matching.

In the example shown in FIG. 23B, the second portion 8b in the first metal layer 5 and the second portion 8b (fourth portion 8e) in the second metal layer 9 overlap each other as viewed from above. The substrate 2 further includes a plurality of additional metal layers 15 between the first portion 8a in the first metal layer 5 and the first portion 8a (third portion 8d) in the second metal layer 9. This structure allows the first metal layer 5 and the second metal layer 9 to surround the additional metal layer 15 and further reduces electromagnetic noise affecting the additional metal layer 15. When the additional metal layer 15 includes a wide solid pattern (ground potential or power potential), the structure can reduce fluctuations in the additional metal layer 15 caused by electromagnetic noise, which may otherwise cause malfunctions or operational failures in the electronic device 21.

The additional metal layer 15 in the examples shown in FIGS. 23A and 23B may include a signal wire or a solid pattern (ground potential or power potential) in one or more embodiments.

In some embodiments, the first metal layer 5 may include the second portion 8b only on each of the two ends in the longitudinal direction of the layer, and the second metal layer 9 located below the first metal layer 5 may comprise the third wire 9a and the fourth wire 9b. In other words, the structure may include a single first metal layer 5 and two or more second metal layers 9. In this structure, the first metal layer 5 can comprise a larger area and thus comprise a lower resistance than when the first metal layer 5 includes a plurality of metalized portions. This structure thus reduces the resistance of the first metal layer 5, and allows adjustment of the positions of the third wire 9a and the fourth wire 9b included in the second metal layer 9 to enable locally effective shielding. For two sets of pair wires, for example, the second metal layer 9 including the plurality of metalized portions may be located at each of two positions. This further reduces electromagnetic noise affecting the area between the two sets of pair wires.

The present invention is not limited to the examples described in the above embodiments. All the features including numerical values in the embodiments may be combined or modified variously modified, including numerical values, unless any contradiction arises. For example, although the electrodes 3 are rectangular as viewed from above in the examples shown in FIG. 1A to FIG. 23B, they may be circular or may be other polygons. In the embodiments, any number of electrodes 3 with any shapes may be in any arrangement, and the electronic component may be mounted with any method.

REFERENCE SIGNS LIST 1 electronic component mounting board
2 substrate
2a first insulating layer
2b second insulating layer
2c third insulating layer
2f additional insulating layer
3 electrode
5 first metal layer
5a first wire
5b second wire
5c additional signal wire
6 insulating film
6a first insulating film
6b second insulating film
6c third insulating film
7 cutout
7a metalized layer
8 portions in wire layers
8a first portion
8b second portion
8c first slope
8d third portion
8e fourth portion
8f second slope
9 second metal layer
9a third wire layer
9b fourth wire layer
10 electronic component 12 lid
13 electronic component connection
14 lid bond
15 additional metal layer
21 electronic device
22 electronic part
31 electronic module
32 housing
42 insulating sheet
42a first insulating sheet
42b second insulating sheet
45 internal wire paste
45a first wire paste
45b second wire paste
46a first insulating paste
46b second insulating paste
46c third insulating paste

What is claimed is:

1. An electronic component mounting board, comprising:
   a substrate including
      a mount area in which an electronic component is mountable;
      a first insulating layer overlapping the mount area;
      a second insulating layer located on a lower surface of the first insulating layer;
      a first metal layer located between the first insulating layer and the second insulating layer; and
      a through hole extending through at least one of the first insulating layer and the second insulating layer in the mount area,
   wherein
   in a cross-sectional view, the first metal layer includes a first portion located parallel to the mount area, a second portion located at an end of the first metal layer and above or below the first portion, and a first slope extending between the first portion and the second portion, and
   the second portion extends from the first slope and is inclined to the first slope, wherein the first slope has an upper surface in contact with the first insulating layer and a lower surface in contact with the second insulating layer, the upper surface and lower surface being inclined with respect to the first portion.

2. The electronic component mounting board according to claim 1, wherein
   the first metal layer includes a first wire, and a second wire with a space left from the first wire.

3. The electronic component mounting board according to claim 2, wherein
   in a cross-sectional view, the second portion is located parallel to the mount area.

4. The electronic component mounting board according to claim 1, wherein
   in a cross-sectional view, the second portion is located parallel to the mount area.

5. The electronic component mounting board according to claim 4, wherein
   the substrate includes a second metal layer located on a lower surface of the second insulating layer, and a third insulating layer located on a lower surface of the second metal layer, and
   in a cross-sectional view, the second metal layer includes a third portion located parallel to the mount area, a fourth portion located below or above the third portion, and a second slope extending between the third portion and the fourth portion.

6. The electronic component mounting board according to claim 5, wherein
   at least one set selected from the second portion and the fourth portion, the first portion and the fourth portion, and the second portion and the third portion comprises an overlap between the portions.

7. The electronic component mounting board according to claim 1, wherein
   the substrate comprises a cutout extending from a side wall of the first insulating layer to a side wall of the second insulating layer, and includes a metalized layer located in the cutout.

8. The electronic component mounting board according to claim 1, wherein
   the substrate includes a second metal layer located on a lower surface of the second insulating layer, and a third insulating layer located on a lower surface of the second metal layer.

9. The electronic component mounting board according to claim 8, wherein
   in a cross-sectional view, the second metal layer includes a first portion located parallel to the mount area, a second portion located below or above the first portion, and a first slope extending between the first portion and the second portion.

10. The electronic component mounting board according to claim 1, wherein
    the first metal layer is electrically connected to a ground potential.

11. An electronic device, comprising:
    the electronic component mounting board according to claim 1, and
    an electronic component mounted on the electronic component mounting board.

12. The electronic component mounting board according to claim 1, wherein the through hole extends through the first insulating layer and the second insulating layer in the mount area.

13. The electronic component mounting board according to claim 1, wherein an upper surface of the second insulating layer has an inclined portion corresponding to the first slope of the first metal layer.

* * * * *